United States Patent
Kohama et al.

(10) Patent No.: US 9,401,705 B2
(45) Date of Patent: Jul. 26, 2016

(54) GATE DRIVING DEVICE

(75) Inventors: Takanori Kohama, Matsumoto (JP); Kazutaka Masuzaw, Ueda (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 14/111,915

(22) PCT Filed: Jul. 5, 2012

(86) PCT No.: PCT/JP2012/004383
§ 371 (c)(1),
(2), (4) Date: Dec. 18, 2013

(87) PCT Pub. No.: WO2013/005443
PCT Pub. Date: Jan. 10, 2013

(65) Prior Publication Data
US 2014/0091850 A1 Apr. 3, 2014

(30) Foreign Application Priority Data

Jul. 7, 2011 (JP) .................................. 2011-150777

(51) Int. Cl.
*H03B 1/00* (2006.01)
*H03K 3/00* (2006.01)
*H03K 17/0812* (2006.01)
*H03K 17/06* (2006.01)
(Continued)

(52) U.S. Cl.
CPC ............ *H03K 17/0812* (2013.01); *H03K 17/06* (2013.01); *H03K 17/567* (2013.01); *H02M 3/155* (2013.01); *H03K 2217/0081* (2013.01)

(58) Field of Classification Search
CPC .......... H03K 17/04126; H03K 17/063; H03K 2217/0036; H03K 17/601; H03K 17/0826
USPC ......... 327/108–112, 378–381, 530, 538, 540, 327/541
See application file for complete search history.

(56) References Cited

U.S. PATENT DOCUMENTS

| 5,202,619 A | 4/1993 | Furuhata et al. |
| 2008/0290853 A1 | 11/2008 | Ito |

(Continued)

FOREIGN PATENT DOCUMENTS

| JP | H02-7714 A | 1/1990 |
| JP | 04-115715 A | 4/1992 |

(Continued)

OTHER PUBLICATIONS

European Search Report dated Jan. 12, 2015.

*Primary Examiner* — Diana J Cheng
(74) *Attorney, Agent, or Firm* — Rabin & Berdo, P.C.

(57) ABSTRACT

The present invention copes with fluctuations in a power supply voltage when a capacitor for coping with fluctuations in the power supply voltage has been omitted and also cases in which the power supply voltage is constantly low, thereby ensuring driving of an active element. A gate driving device of an IGBT includes: a first switch portion which turns on the IGBT; a second switch portion which turns off the IGBT; a current control portion which controls the outflow of charge on the gate to a ground line such that current is constant; a first protection circuit which suppresses outflow of gate current to the power supply line; and a second protection circuit which detects a prescribed fluctuation in an internal power supply voltage Vdc, and interrupts the connection between the current control portion and the ground line.

6 Claims, 16 Drawing Sheets

| (51) | Int. Cl. | |
|---|---|---|
| | *H03K 17/567* | (2006.01) |
| | *H02M 3/155* | (2006.01) |

(56) References Cited

U.S. PATENT DOCUMENTS

2008/0291599 A1  11/2008  Andoh
2010/0289562 A1  11/2010  Kohama et al.

FOREIGN PATENT DOCUMENTS

| JP | 06-318678 A | 11/1994 |
| JP | 2000-059195 A | 2/2000 |
| JP | 2001-143482 A | 5/2001 |
| JP | 2008-291728 A | 12/2008 |
| JP | 2009-141783 A | 6/2009 |
| JP | 2010-288444 A | 12/2010 |

GATE DRIVING DEVICE

TECHNICAL FIELD

This invention relates to a gate driving device which drives the gate of an active element with a large input capacitance, such as an IGBT (Insulated Gate Bipolar Transistor), a power MOSFET (Metal Oxide Semiconductor Field Effect Transistor), or similar.

BACKGROUND ART

Gate driving devices of this type have been proposed having various configurations, such as for example those described in Japanese Patent Application Laid-open No. 2008-291728 and Japanese Patent Application Laid-open No. 2010-288444.

Japanese Patent Application Laid-open No. 2008-291728 discloses a device which uses an IGBT to control the current flowing in primary-side windings to control ignition by a plug connected to the coil secondary-side windings, and achieves both reduced turn-on voltage for low battery voltages and a sufficient conduction start time.

Japanese Patent Application Laid-open No. 2010-288444 discloses a gate driving device in which, as shown in FIG. 11, the load is taken to be an inductance L, and the gate of an IGBT or other active element having a current sensing function is driven by a control IC 4.

In the case of this gate driving device, the inductance L as the load and an IGBT 3 are connected in series between a power supply line 1 to which the power supply voltage Vbatt of a battery as an external power supply and a ground line 2 connected to ground gnd.

Further, the control IC 4, and a current-limiting resistor RB for when a voltage equal to or greater than the clamp voltage of the IC 4 is applied across A-B, are connected in parallel with the inductance L and IGBT 3. A current sense voltage Vsns output from a current sensing terminal s of the IGBT 3 is input to this control IC 4. The gate voltage Vg output from the control IC 4 is supplied to the gate of the IGBT 3.

Further, a noise elimination capacitor C1 which eliminates high-frequency noise from the inductance L is connected in parallel with the series circuit of the current-limiting resistor RB and control IC 4. A high-pass capacitor C2 is connected to the power supply line 1 and the ground line 2 in parallel with the control IC 4. L1 and L2 are the wiring inductances of the power supply line 1 and ground line 2.

FIG. 12 shows a specific configuration of a portion related to driving control of the IGBT 3 by the control IC 4 shown in FIG. 11.

As shown in FIG. 12, in the control IC 4, a constant-current source 5, P-type MOS transistor M1, and N-type MOS transistor M3 are connected in series between a power supply line 11 to which an internal power supply voltage Vdc0 is applied and a ground line 12 connected to ground gnd. A P-type MOS transistor for current control M2 is connected in parallel with the MOS transistor M3. Parasitic body diodes D1 to D3 are connected in parallel with the MOS transistors M1 to M3. The op-amp 6 and resistors R1 and R2 form an error amplifier, to control the gate voltage of the MOS transistor M2.

Using a control IC 4 configured in this way, the MOS transistors M1 and M3 are controlled to turn on/off by switch signals SWp, SWn synchronized with a control signal Sin input to the control IC 4 shown in FIG. 11, to control charging/discharging of the IGBT 3. That is, when the MOS transistor M1 is turned on the IGBT 3 is charged, and when the MOS transistor M1 is turned off the IGBT 3 is discharged.

The op-amp 6 controls the gate voltage of the MOS transistor M2 such that the current sense voltage Vsns obtained by using a sense resistor to convert the sense current input from the current sense terminal S of the IGBT 3 into a voltage is equal to the reference voltage Vref; by this means, the gate voltage Vg of the IGBT 3 is controlled to control the collector current Ic of the IGBT 3.

If the amplitude of the battery voltage Vbatt fluctuates as a result of battery ripple, the voltage across points A-B in FIG. 11 drops momentarily at the time the battery voltage Vbatt falls due to the resonance circuit formed by the wiring inductances L1 and L2 and the capacitor C1. The momentary drop in voltage gradually increases with increasing collector current Ic of the IGBT 3, and momentarily falls below the minimum operating power supply voltage of the control IC 4.

However, a bypass capacitor C2 is connected in parallel with the control IC 4, and a low-pass filter is formed by this bypass capacitor C2 and the current-limiting resistor RB. Through this low-pass filter effect, the voltage across the bypass capacitor C2 repeatedly undergoes gradual increases and decreases. Consequently the internal power supply voltage Vdc of the control IC 4 is held at a substantially constant voltage which sufficiently exceeds the minimum operating power supply voltage of the control IC 4.

When the bypass capacitor C2 is eliminated with the object of reducing the number of components, the low-pass filter effect can no longer be produced. Hence the voltage across points C-B of the control IC 4 shown in FIG. 11 assumes the same waveform as the voltage across points A-B. Consequently a momentary voltage drop occurs in the internal power supply voltage Vdc, and the gate voltage Vg of the IGBT 3 also undergoes a large momentary voltage drop. As a result a sharp change is imparted to the current Ic flowing in the IGBT 3, and an induced voltage proportional to the current change occurs in the inductance L which is the load.

There are two reasons for the momentary large voltage drop in the gate voltage Vg.

The first reason is that the relation between the internal power supply voltage Vdc of the control IC 4 and the gate voltage Vg temporarily changes to Vdc<Vg, and gate charge accumulated on the gate of the IGBT 3 flows out to the power supply line 11 via the parasitic body diode D1 of the MOS transistor M1. The second reason is that, if there is a sharp voltage drop during current-limiting control, gate charge which has accumulated on the gate of the IGBT 3 via the MOS transistor M2 flows out to the ground line 12.

Thus in order to eliminate the bypass capacitor C2, the above-described problems must be resolved; as a means of improvement, devices such as the control IC 4a shown in FIG. 13 are known (see Japanese Patent Application Laid-open No. 2010-288444).

As shown in FIG. 13, this control IC 4a has the basic configuration of the control IC 4 shown in FIG. 12, but further adds the following constituent elements.

That is, a parallel circuit inserted into the internal power supply line 11 and comprising a resistor R3 and a diode D11, and a voltage drop suppression circuit 80, are added. Further, a diode D12 connected in parallel with the series circuit of the constant-current source 5 and MOS transistor M1, and a resistor R4 inserted between the output terminal of the op-amp 6 and the gate of the MOS transistor M2, are added.

The voltage drop suppression circuit 80 comprises a low voltage detection circuit 8 which detects momentary voltage drops in the internal power supply voltage Vdc0, and a MOS transistor M4 which immediately turns off when the low voltage detection circuit 8 detects a voltage drop. A parasitic body diode D4 is connected in parallel with the MOS transistor M4.

In the control IC 4a configured in this way, when the amplitude of the battery voltage Vbatt fluctuates due to battery ripple, as a result momentary overshoot occurs in the internal power supply voltage Vdc0 of the control IC 4a at the time the voltage falls. This overshoot of the internal power supply voltage Vdc0 increases with increasing collector current Ic of the IGBT 3, and finally falls below the minimum operating voltage of the control IC 4.

That is, due to resonance between the wiring inductances L1 and L2 and the noise elimination capacitor C1, the terminal voltage Vab calls. Under this influence a state ensues in which the internal power supply voltage Vdc0 falls, and momentarily falls below the minimum operating voltage of the control IC 4a.

However, the low voltage detection circuit 8 detects such a momentary voltage drop of the internal power supply voltage Vdc0, and immediately turns off the MOS transistor M4 based on this detection. Hence discharging of charge accumulated on the gate of the IGBT 3 to the ground line 12 via the MOS transistors M2 and M4 can be reliably prevented. As a result, the IGBT 3 can continue to operate in the on state.

On the other hand, when the internal power supply voltage Vdc0 is lower than the gate voltage Vg of the IGBT 3 due to a momentary drop in the internal power supply voltage Vdc0, charge which has accumulated on the gate of the IGBT 3 flows out to the power supply line 11 via the parasitic body diode D1 of the MOS transistor M1 (or the diode D12).

However, the parallel circuit of the diode D11 and the resistor R3 is inserted into the power supply line 11. Hence the diode D11 prevents the outflow of gate charge to the internal power supply circuit (not shown) connected to the power supply line 11. Further, the resistor R3 forms a low-pass filter with the capacitance of the gate of the IGBT 3, and so momentary movement of gate charge toward the internal power supply circuit is prevented, and in addition the minimum limiting current at which operation of the circuit connected to the internal power supply is possible is supplied.

As explained above, when a momentary voltage drop occurs in the internal power supply voltage Vdc0 within the control IC 4a shown in FIG. 13, outflow of gate charge from the IGBT 3 to the internal power supply circuit and outflow to the ground line 12 can both be reliably suppressed. Hence the IGBT 3 can hold the gate charge and suppress drops in the gate voltage Vg, and the internal power supply voltage Vdc on the downstream side of the parallel circuit of the diode D11 and resistor R3 in the control IC 4a can be held at a voltage slightly reduced from the voltage immediately before the drop in the internal power supply voltage Vdc.

Moreover, despite large fluctuations in the internal power supply voltage Vdc0, extremely small fluctuations in the internal power supply voltage Vdc can be suppressed and the internal power supply can be stabilized. Hence another purpose can be served of temporarily augmenting (supplying) the voltage for another circuit which uses the internal power supply voltage Vdc as a power supply.

However, in the control IC 4a shown in FIG. 13, when for example the power supply voltage is constantly at low voltage, it is no longer possible to ignore voltage drops across the point of supply of the internal power supply voltage Vdc0 of the power supply line 11 and the gate of the IGBT 3, and there is the possibility that the gate voltage Vg of the IGBT 3 may drop and the IGBT 3 can no longer be driven adequately.

On the other hand, a control IC 4b such as that shown in FIG. 14 has been proposed.

This control IC 4b adds a regulator circuit 7 to the configuration of the control IC 4a shown in FIG. 13. The regulator circuit 7 stabilizes the voltage Vbin across points C-B in FIG. 11, and outputs a stabilized voltage Vreg.

FIG. 15 shows a specific example of the low voltage detection circuit 8 shown in FIG. 14 (see Japanese Patent Application Laid-open No. 2010-288444).

As shown in FIG. 15, this low voltage detection (under-voltage detector) circuit 8 comprises a self-biased type comparator 81, connected between the internal power supply line 11 to which the internal power supply voltage Vdc is supplied and the ground line 12 connected to ground gnd.

The non-inverting input of this comparator 81 is connected to the connection point between a resistor R11 and an N-type MOS transistor M11, which are connected in series between the internal power supply line 11 and the ground line 12. The inverting input of the comparator 81 is connected to the connection point between a diode D31 and a resistor R13, which are connected in series between the line 13 to which the output voltage Vreg of the regulator circuit 7 is applied and the ground line 12.

A parallel circuit of an inverter 82, a resistor R14 and a diode D32 the cathode of which is on the side of the comparator 81 is inserted between the output side of the comparator 81 and the N-type MOS transistor M4, and a gate signal is output from this parallel circuit to the gate of the MOS transistor M4. C10 is the gate-emitter capacitance of the MOS transistor M4.

Next, an example of operation of the low voltage detection circuit 8 shown in FIG. 15 is explained, referring to FIG. 14 to FIG. 16.

As shown in FIG. 16(A), the voltage Vbin across points C-B in FIG. 11 is raised (increased) from the minimum value (0 V) to the maximum value, and upon reaching the maximum value, falls (decreases) to the minimum value.

This change in the voltage Vbin is accompanied by a rise in the output voltage Vreg of the regulator circuit 7 shown in FIG. 14 and the internal power supply voltage Vdc, while maintaining the relation Vreg>Vdc, as shown in FIG. 16(A); each reaches a constant value and maintains the constant value. Thereafter, each falls from the respective constant value to the minimum value.

This change is accompanied by a change in the input voltage V+ of the non-inverting input terminal (+) and the input voltage V− of the inverting input terminal (−) of the comparator 81 shown in FIG. 15, as shown in FIG. 16(B), and the input voltage V− is always higher than the input voltage V+. This is because the rise in the output voltage Vreg is earlier than that of the internal power supply voltage Vdc, and moreover the forward-direction voltage of the diode D31 is lower than the threshold voltage of the MOS transistor M11.

As a result the output CMPout of the comparator 81 goes to L level (low level), as shown in FIG. 16(C). In FIG. 16(C), where there is a minute voltage, an indeterminate state occurs at the rising or falling of the power supply.

The output of the comparator 81 is logically inverted by the inverter 82, and so the output of the inverter 82 is H level (high level). Hence the output voltage OUTB of the low voltage detection circuit 8 shown in FIG. 15 is always H level, as shown in FIG. 16(D), and is applied to the gate of the MOS transistor M4 shown in FIG. 14.

As a result, the drain current Id of the MOS transistor M4 is the current shown in FIG. 16(E). That is, in the state at which the power supply voltage is low (low power supply voltage state), the VREF potential, which ordinarily should be constant, falls, and together with this the charge which should have charged the gate of the IGBT 3 flows out to the ground line 12 via the MOS transistor M4 due to the operation of the op-amp 6, so that the voltage at the gate of the IGBT 3 falls. As a result, when in the low power supply voltage state, the current Ic flowing in the IGBT 3 is limited to a low current range.

DISCLOSURE OF THE INVENTION

The present invention focuses on the above-described problems, and has as an object the provision of a gate driving device which can address fluctuations in a power supply voltage and secure driving of an active element even when a capacitor necessary to address fluctuations in the power supply voltage is omitted, and moreover which can secure driving of the active element even when the power supply voltage is constantly at a low power supply voltage.

In order to attain the above-described object, one mode of the invention is a gate driving device which drives a gate of an active element with a large input capacitance, this device including: a first switch portion which is provided between a high potential side first power supply line and a gate of the active element and which turns on the active element; a second switch portion which is connected between the gate of the active element and a low potential side second power supply line and which turns off the active element; a current control portion which is provided in parallel with the second switch portion and which controls outflow of charge on a gate of the active element to the second power supply line such that a current that flows in the active element is constant; a first protection circuit which is provided between the first switch portion and the gate of the active element and which suppresses outflow of charge on the gate of the active element to the first power supply line; and a second protection circuit which is provided between the current control portion and the second power supply line and which detects a prescribed fluctuation in an applied voltage between the first power supply line and the second power supply line, and when the fluctuation is detected, interrupts the connection between the current control portion and the second power supply line.

In another mode of this invention, the first switch portion includes a first transistor, and the first transistor operates as a constant-current source when the active element is turned on and halts the operation as a constant-current source when the active element is turned off.

Further, in another mode of this invention, the first switch portion includes a second transistor which together with the first transistor forms a current mirror circuit, and a third transistor which is connected in series with the second transistor and which turns on and off according to whether the active element is on or off.

Further, in another mode of this invention, the second protection circuit comprises a diode which prevents outflow of charge on the gate of the active element to the first power supply line, and a resistor which is connected in parallel with the diode and which forms a low-pass filter with the gate capacitance of the active element.

Another mode of this invention is a gate driving device which drives a gate of an active element with a large input capacitance, this device including: a first switch portion which is provided between a high potential side first power supply line and the gate of the active element and which turns on the active element; a second switch portion which is connected between the gate of the active element and a low potential side second power supply line and which turns off the active element; a current control portion which is provided in parallel with the second switch portion and which controls outflow of charge on the gate of the active element to the second power supply line such that a current that flows in the active element is constant; a first protection circuit which is provided between an external power supply and the first power supply line and which suppresses outflow of charge on the gate of the active element to the external power supply; and a second protection circuit which is provided between the current control portion and the second power supply line and which, upon detecting a momentary drop in a voltage of the external power supply or upon detecting that a voltage of the external power supply is in a low power supply voltage state, interrupts connection between the current control portion and the second power supply line.

Thus in one mode of the invention, a first protection circuit and a second protection circuit are provided, so that a bypass capacitor can be omitted, and even when the power supply voltage fluctuates, fluctuation of the gate voltage of the active element can be suppressed to the extent possible, and adequate driving of the gate of the active element can be secured.

Further, in one mode of the invention, a first switch portion and a first protection circuit only are provided between the first power supply line and the active element gate, so that compared with the prior art, voltage drops between the first power supply line and the gate of the active element can be reduced. Consequently driving of the active element can be secured even when the power supply voltage is constantly a low power supply voltage.

Further, in one mode of the invention, a second protection circuit, upon detecting that the voltage of an external power supply is in a low power supply voltage state, interrupts the connection between the current control portion and the second power supply line. Hence in low power supply voltage operation the active element can be driven without limiting the current flowing therein, without drops in the voltage input to the active element.

BEST MODE FOR CARRYING OUT THE INVENTION

Below, embodiments of the invention are explained based on the drawings.

Configuration of a First Embodiment

Figure 1:
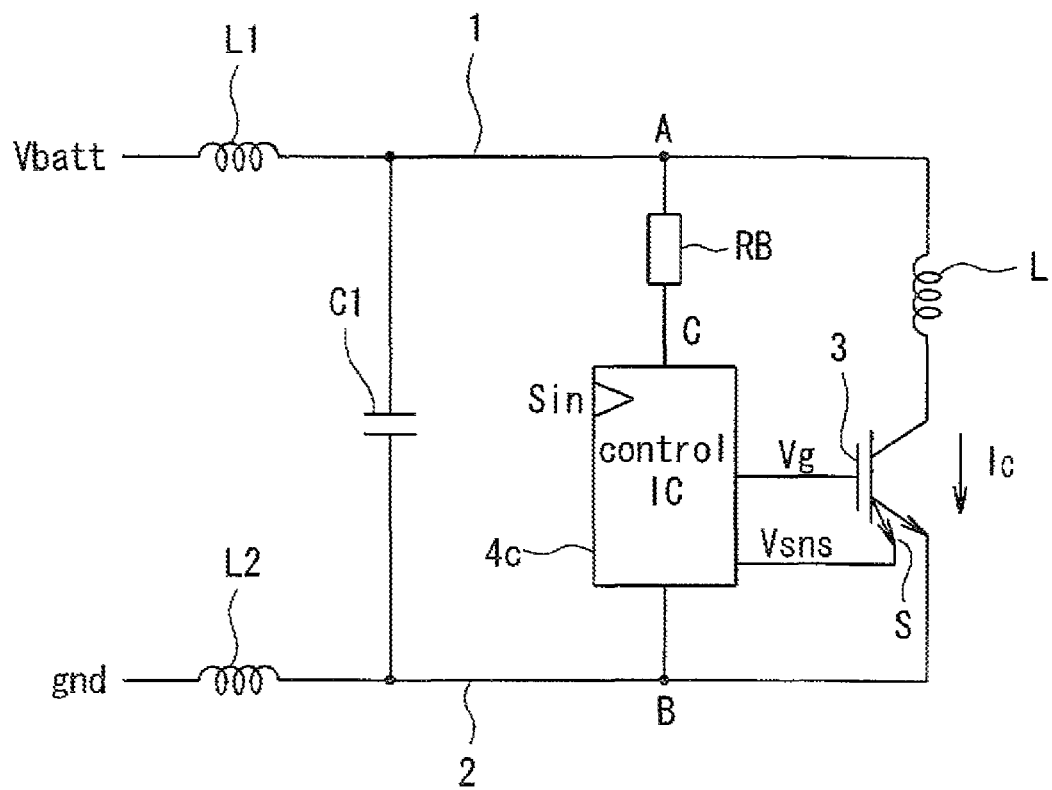
FIG. 1 is a circuit diagram showing a first embodiment of a gate driving device of the invention.

FIG. 1 is a circuit diagram showing a first embodiment of a gate driving device of the invention.

Figure 11:
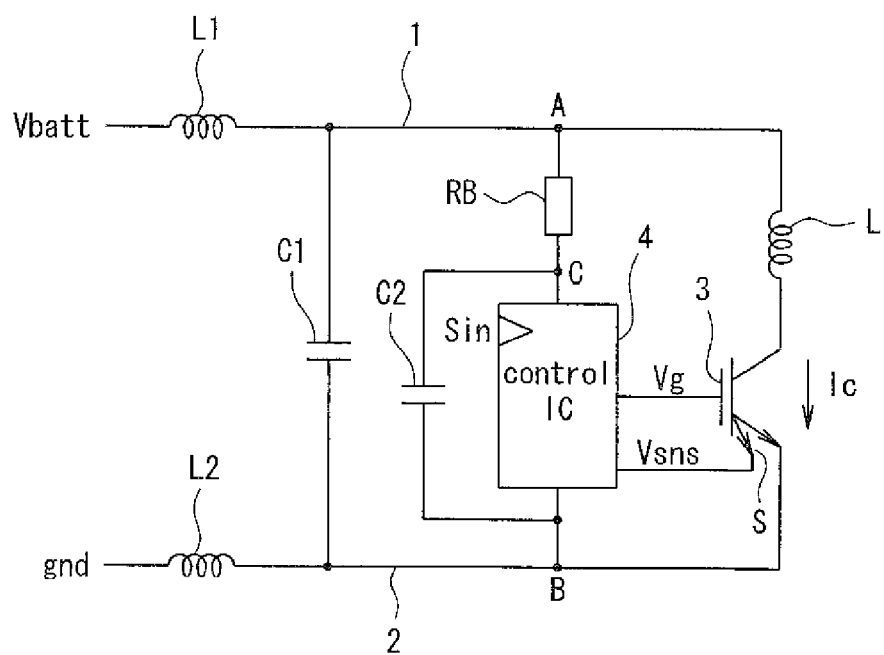
FIG. 11 is a circuit diagram showing the configuration of a device of the prior art.
Figure 12:
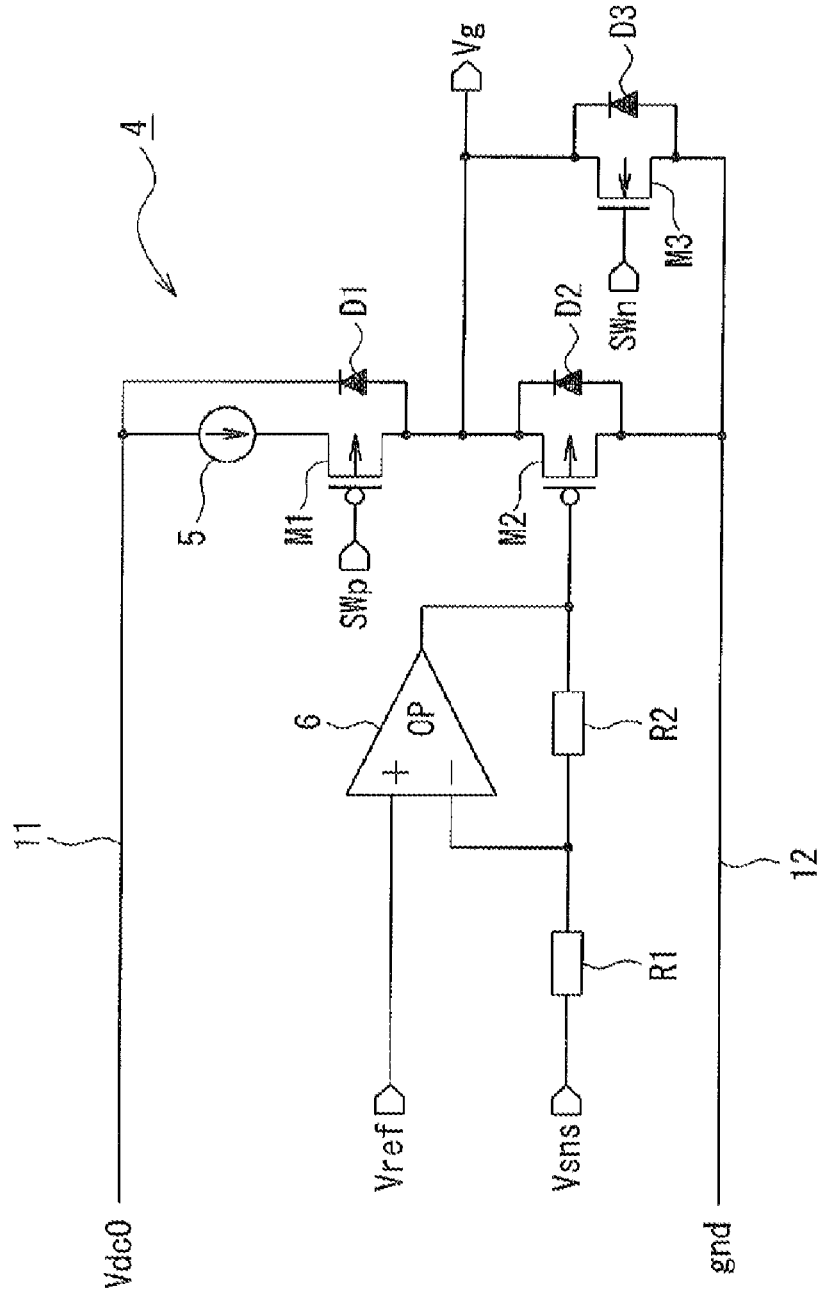
FIG. 12 is a circuit diagram of the control IC shown in FIG. 11.

As shown in FIG. 1, the first embodiment of a gate driving device drives the gate of an active element with a large input capacitance such as an IGBT 3, and substitutes the control IC 4c for the control IC 4 in FIG. 11, as well as eliminating the bypass capacitor C2 in FIG. 11.

That is, in the first embodiment, an inductance L as the load and an IGBT 3 are connected in series between the power supply line 1 to which the battery power supply voltage Vbatt is applied as an external power supply, and the ground line 2 connected to ground gnd.

The control IC 4c and a current-limiting resistor RB for when a voltage equal to or greater than the clamp voltage of the IC 4c is applied across the points A-B are connected in parallel with the inductance L and the IGBT 3. A current sense voltage Vsns output from the current sense terminal s of the IGBT 3 is input to the control IC 4c. The gate voltage Vg output from the control IC 4c is supplied to the gate of the IGBT 3.

Further, a noise elimination capacitor C1 which eliminates high-frequency noise from the inductance L is connected in parallel with the series circuit of the current-limiting resistor RB and control IC 4c. L1 and L2 are the wiring inductances of the power supply line 1 and the ground line 2.

(Configuration of the Control IC)

Figure 2:
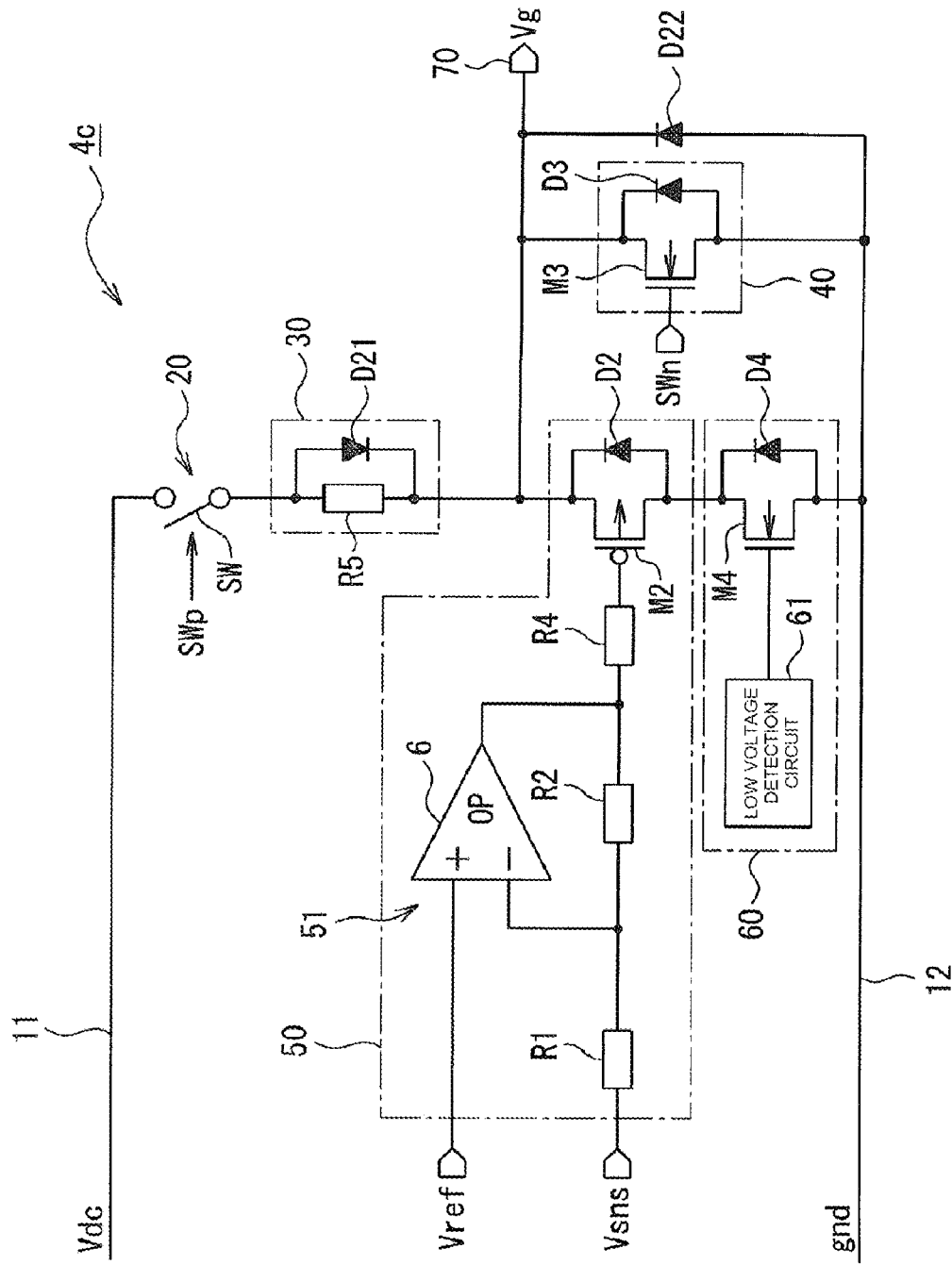
FIG. 2 is a circuit diagram of the control IC shown in FIG. 1.

Next, a specific configuration of the gate control portion of the control IC 4c shown in FIG. 1 is explained, referring to FIG. 2.

In the control IC 4c, a gate control portion is connected as shown in FIG. 2 between the internal power supply line 11 connected to a regulator circuit (not shown) which generates an internal power supply voltage Vdc (=Vreg) based on the battery power supply voltage Vbatt input via the current-limiting resistor RB shown in FIG. 1, and the ground line 12 connected to ground gnd.

As shown in FIG. 2, this gate control portion comprises a first switch portion 20, first protection circuit 30, second switch portion 40, current control portion 50, and second protection circuit 60. These components are provided between the power supply line 11 which is the power supply line on the high potential side, and the ground line 12 which is the power supply line on the low potential side.

Specifically, the first switch portion 20, first protection circuit 30 and second switch portion 40 are connected in series between the power supply line 11 and the ground line 12. Further, the connection portion common to the first protection circuit 30 and the second switch portion 40 is connected to the output terminal 70, and this output terminal 70 is connected to the gate of the IGBT 3. The current control portion 50 and second protection circuit 60 are connected in series parallel to the second switch portion 40.

The first switch portion 20 is provided between the power supply line 11 and the first protection circuit 30, and comprises a switching element SW which is controlled to turn on and off by a switch signal Swp. This switching element SW, when turned on, charges the gate of the IGBT 3.

The first protection circuit 30 suppresses the outflow of charge on the gate of the IGBT 3 to the power supply line 11, and forms a low-pass filter with the gate capacitance of the IGBT 3, and comprises a parallel circuit of a diode D21 and resistor R5 connected in parallel. One end of this parallel circuit is connected to the switching element SW and the other end is connected to the output terminal 70 connected to the gate of the IGBT 3.

The second switch portion 40 comprises an N-type MOS transistor M3; this MOS transistor M3 includes a parasitic body diode D3 connected in parallel. The parallel circuit of the MOS transistor M3 and diode D3 is connected between the output terminal 70 and the ground line 12. When the MOS transistor M3 is turned on, the charge on the gate of the IGBT 3 is discharged. Here, a diode D22 which provides a clamp function during conduction (turn-on) of the switching element SW is connected in parallel with the second switch portion 40.

The current control portion 50 is provided in parallel with the second switch portion 40, and controls outflow of charge on the gate of the IGBT 3 to the ground line 12 such that the collector current flowing in the IGBT 3 is constant.

To this end, the current control portion 50 comprises a MOS transistor M3 connected between the output terminal 70 and the MOS transistor M4 of the second protection circuit 60, and an error amplifier 51 which controls the gate voltage of this MOS transistor M2. The error amplifier 51 comprises an op-amp 6 and resistors R1, R2 and R4. The error amplifier 51 generates a voltage according to the difference between the current sense voltage Vsns input from the current sense terminal s of the IGBT 3 and the reference voltage Vref, and outputs this voltage to the MOS transistor M2.

The second protection circuit 60 is provided between the current control portion 50 and the ground line 12, and detects prescribed fluctuations in the internal power supply voltage Vdc, and upon detecting such a fluctuation, interrupts the connection between the current control portion 50 and the ground line 12.

To this end, the second protection circuit 60 comprises a low voltage detection circuit 61 which detects momentary voltage drops in the internal power supply voltage Vdc, and a MOS transistor M4 which immediately turns off when this low voltage detection circuit 61 detects a voltage drop. A parasitic body diode D4 is connected in parallel with the MOS transistor M4. This parallel circuit is connected between the MOS transistor M2 of the current control portion 50 and the ground line 12.

(Operation of the Control IC)

Figure 3:
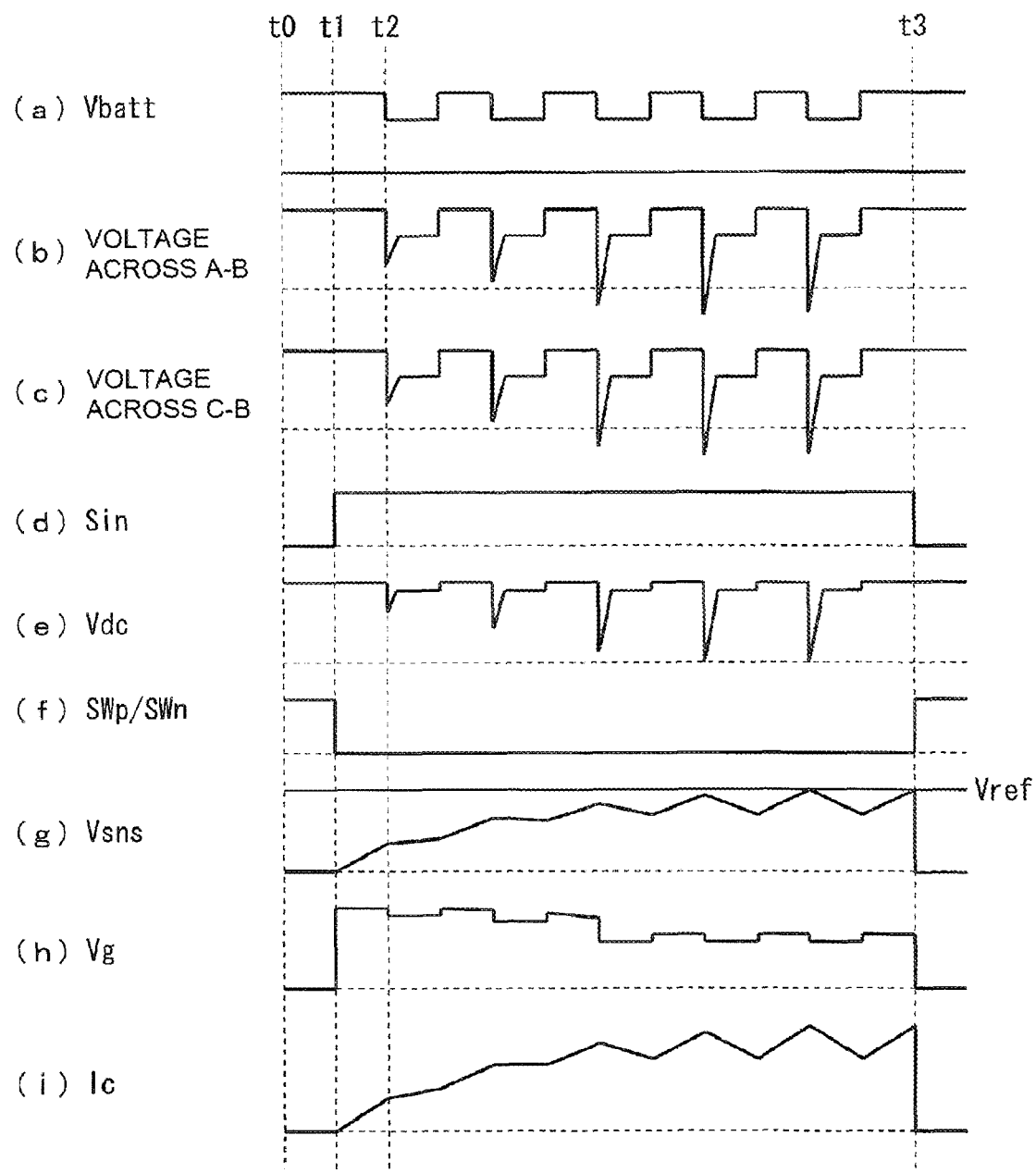
FIG. 3 is a waveform diagram of different portions to explain operation of the control IC shown in FIG. 2.

Next, an example of operation of the control IC 4c is explained, referring to FIG. 1 to FIG. 3.

When, at time t0 in FIG. 3, the battery voltage Vbatt shown in FIG. 1 is a prescribed constant voltage and is normal, as shown in FIG. 3(a), the voltage across points A-B and the voltage across points C-B shown in FIG. 1 are as shown in FIG. 3(b) and FIG. 3(c). Hence the internal power supply voltage Vdc applied to the internal power supply line 11 in FIG. 2 is as shown in FIG. 3(e), and is substantially equal to the battery voltage Vbatt.

At this time, when the logical value of the control signal Sin input to the gate of the control IC $4c$ is "Low", as shown in FIG. $3(d)$, the logical values of the switch signal SWp which turns the switching element SW on and off and of the switch signal SWn input to the MOS transistor M3 are "High", as shown in FIG. $3(f)$. Hence the switching element SW enters the off state, and the MOS transistor M3 enters the on state.

Consequently the gate voltage Vg of the IGBT 3 goes to ground level, as shown in FIG. $3(h)$, so that the IGBT 3 enters the off state and the current Ic flowing in the IGBT 3 transitions to "0", as shown in FIG. $3(i)$. As a result, the current sense voltage Vsns output from the current sense terminal s of the IGBT 3 also transitions to "0", as shown in FIG. $3(g)$.

Thereafter, at time t1 in FIG. 3, when the logical value of the control signal Sin changes from "Low" to "High" as shown in FIG. $3(d)$, the logical values of the switch signals SWp and SWn are inverted from "High" to "Low" as shown in FIG. $3(f)$. In accordance with this, the switching element SW enters the on state and the MOS transistor M3 is turned off, so that the gate voltage Vg of the IGBT 3 becomes a positive voltage substantially coinciding with the internal power supply voltage Vdc, as shown in FIG. $3(h)$.

Consequently the IGBT 3 enters the on state, and the current Ic flowing in the IGBT 3 gradually increases, as shown in FIG. $3(i)$. In accordance with this, the current sense voltage Vsns generated based on the sense current output from the current sense terminal s of the IGBT 3 gradually increases, as shown in FIG. $3(g)$. Thereafter the current control portion 50 performs current limiting processing such that the sense voltage Vsns substantially coincides with the reference voltage Vref.

Suppose that at time t2 in FIG. 3, a voltage fluctuation has occurred in which the battery voltage Vbatt undergoes a voltage drop repeatedly with a prescribed period, as shown in FIG. $3(a)$.

In this case, in accordance with the voltage fluctuations in the battery voltage Vbatt, the internal power supply voltage Vdc in the control IC $4c$ undergoes momentary overshoot at the point of the falling edge of the voltage fluctuation, as shown in FIG. $3(e)$, and this overshoot increases with increasing collector current Ic, finally falling below the minimum operating voltage of the control IC $4c$.

That is, due to the resonance of the wiring inductances L1, L2 and the noise elimination capacitor C1, shown in FIG. 1, the voltage across the points A-B in FIG. 1 falls (see FIG. $3(b)$). Under this influence the internal power supply voltage Vdc falls and momentarily becomes less than the minimum operating voltage of the control IC $4c$, as shown in FIG. $3(e)$.

However, when fluctuations in the internal power supply voltage Vdc begin, the low voltage detection circuit 61 detects a momentary voltage drop in the internal power supply voltage Vdc, and as a result of this detection, the low voltage detection circuit 61 immediately turns off the MOS transistor M4.

Hence even when the current control portion 50 executes conduction control of the MOS transistor M2 such that the current sense voltage Vsns is made to coincide with the reference voltage Vref, the MOS transistor M4 continues in the off state. As a result, discharging of charge accumulated on the gate of the IGBT 3 to the ground line 12 through the MOS transistor M2 can be reliably prevented. By this means, the IGBT 3 can be made to continue in the on state.

On the other hand, if the gate voltage Vg of the IGBT 3 becomes higher than the internal power supply voltage Vdc due to a momentary sharp drop in the internal power supply voltage Vdc, charge accumulated on the gate of the IGBT 3 attempts to flow out to the internal power supply line 11.

However, the first protection circuit 30, in which the resistor R5 and diode D21 are connected in parallel, is inserted between the output terminal 70 (gate of the IGBT 3) and the switching element SW. Hence the outflow of accumulated charge to the internal power supply line 11 is prevented by the diode D21. Further, the gate capacitance of the IGBT 3 and the resistor R5 form a low-pass filter, so that momentary movement of the above-described accumulated charge to the internal power supply line 11 can be prevented, and the minimum current necessary to enable operation of the circuit connected to the internal power supply is provided.

In this way, in the control IC $4c$ shown in FIG. 2, when a momentary voltage drop has occurred in the internal power supply voltage Vdc, outflow of charge on the gate of the IGBT 3 to both the internal power supply line 11 and to the ground line 12 can be reliably suppressed. As a result, for the IGBT 3 the gate charge can be held and drops in the gate voltage Vg can be suppressed.

Consequently, the gate voltage Vg of the IGBT 3 can be limited to small-amplitude fluctuations without any sharp drops, as shown in FIG. $3(h)$. In accordance with this, the current Ic flowing in the IGBT 3 can be made to increase stably, as shown in FIG. $3(i)$. Hence the occurrence of induced voltages proportional to current changes in the inductance L as the load can be reliably prevented.

Modified Example of the Control IC

Figure 4:
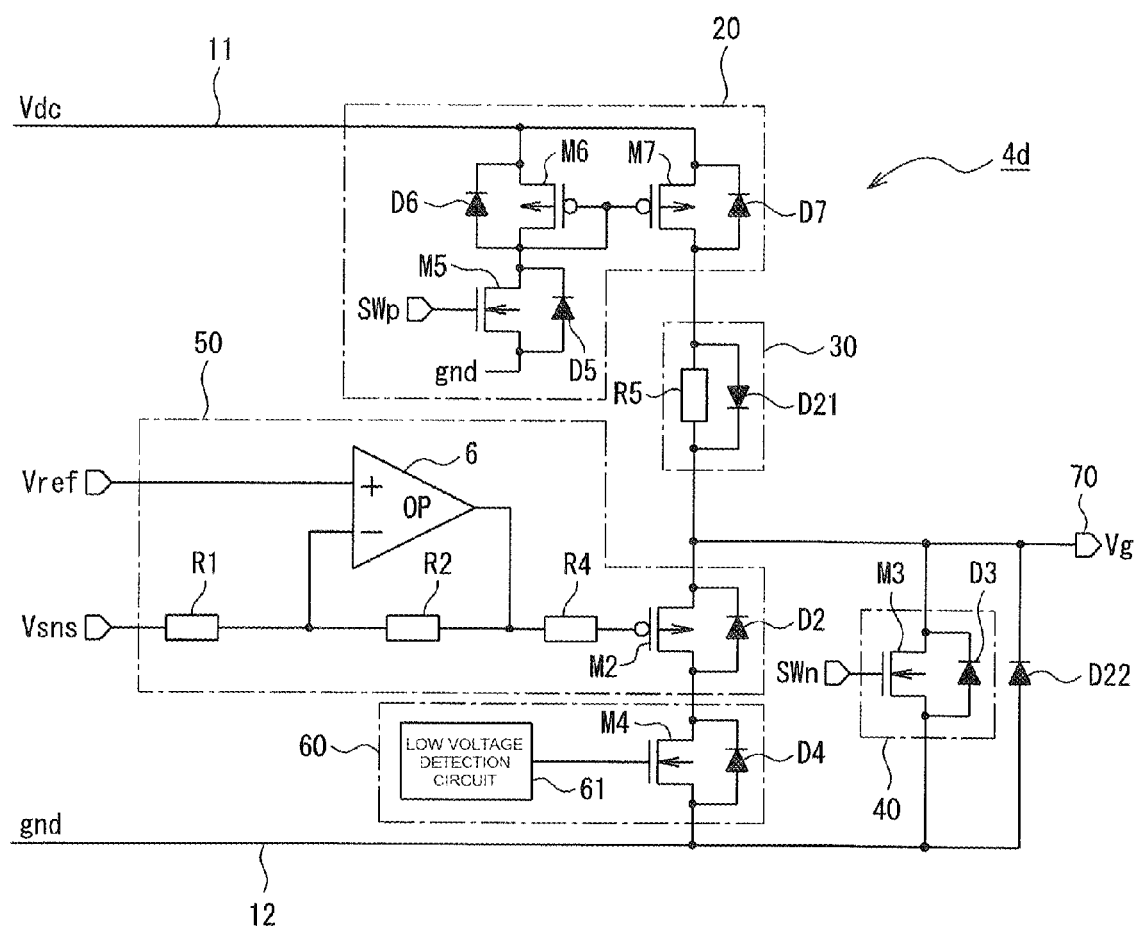
FIG. 4 is a circuit diagram showing the configuration of a modified example of the control IC shown in FIG. 2.

Next, the configuration of a modified example of the control IC is explained, referring to FIG. 4.

As shown in FIG. 4, the control IC $4d$ of this modified example is based on the configuration of the control IC $4c$ shown in FIG. 2, but substitutes the configuration of the first switch portion 20 shown in FIG. 4 for the switching element SW of FIG. 2.

Hence portions which are the same as constituent elements of the control IC $4c$ shown in FIG. 2 are assigned the same symbols, and explanations are omitted.

As shown in FIG. 4, the first switch portion 20 of the control IC $4d$ comprises an N-type MOS transistor M5 and P-type transistors M6 and M7. Each of the MOS transistors M5 to M7 is connected in parallel with parasitic body diodes D5 to D7.

In the first switch portion 20, the MOS transistor M7 is made to function as a constant-current source, the MOS transistor M5 is turned on and off by the switch signal SWp, and by means of this on-off operation, the above-described constant-current source function is turned on and off.

Specifically, the MOS transistor M7 is provided between the internal power supply line 11 and the first protection circuit 30. Further, the MOS transistor M7 forms a current mirror circuit with the MOS transistor M6. And, the MOS transistor M5 is connected in series with the MOS transistor M6, and the MOS transistor M5 is controlled to turn on and off by the switch signal SWp.

Here the power supply voltage of the circuit which generates the switch signal SWp supplied to the gate of the MOS transistor M5 is lower than the power supply voltage Vdc of the gate control portion of the control IC $4d$, and so the MOS transistor M5 level-shifts the switch signal SWp.

By means of this configuration, by arbitrarily setting the transistor size ratio (mirror ratio) of the MOS transistor M6 and the MOS transistor M7, the current flowing in the MOS transistor M7 can be set to an arbitrary value. And by using the switch signal SWp to turn on the MOS transistor M5, the MOS transistor M7 can be made to function as a constant-current source.

Further, when using the MOS transistor M7 as a constant-current source, the diode D22 serves to limit the current during clamping.

Advantageous Results of the First Embodiment

As explained above, in the first embodiment a first protection circuit 30 and a second protection circuit 60 are provided. Hence in a state in which the parallel bypass capacitor is eliminated in the control IC 4c, even when the power supply voltage input to the control IC 4c momentarily falls below the minimum operating voltage, fluctuations in the gate voltage Vg of the IGBT 3 are suppressed to the extent possible, and adequate driving of the gate of the IGBT 3 can be secured.

Figure 13:
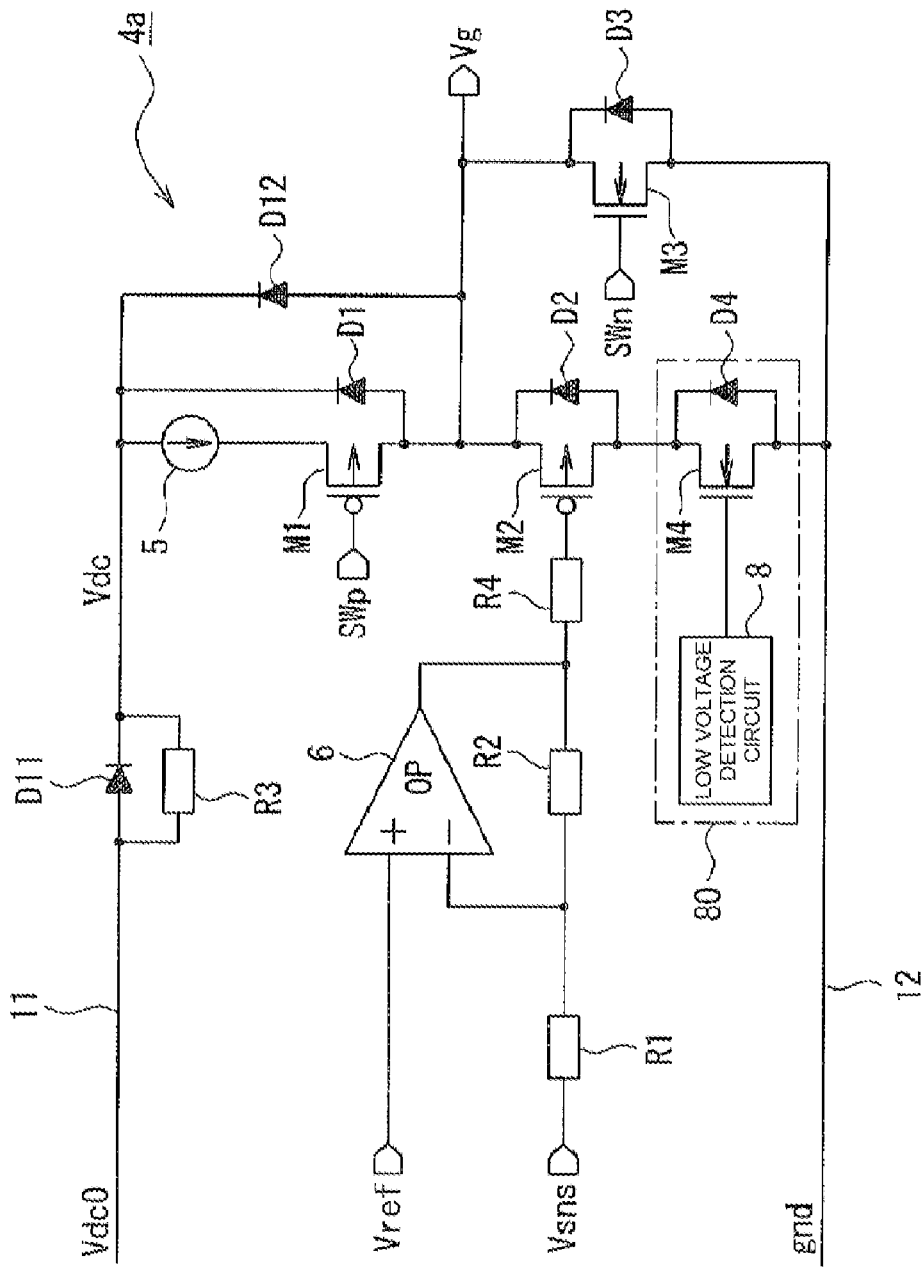
FIG. 13 is a circuit diagram of a control IC of the prior art, as an improvement over the control IC shown in FIG. 12.

Further, in the first embodiment, as shown in FIG. 2, only a switching element SW (MOS transistor M7) and first protection circuit 30 are provided between the internal power supply line 11 and the output terminal 70, so that compared with the prior art, voltage drops between the internal power supply line 11 and the output terminal 70 can be kept small (see FIG. 13). As a result, even when for example the internal power supply voltage Vdc is constantly at a low power supply voltage, the gate voltage Vg of the IGBT 3 can be secured, and adequate driving of the IGBT 3 is possible.

Modified Example of the First Embodiment (1) In the control IC of FIG. 2 and FIG. 4, the internal power supply voltage Vdc applied to the internal power supply line 11 was generated by an internal power supply circuit (not shown) based on a battery power supply voltage Vbatt.

However, in place of this, the voltage applied to the internal power supply line 11 may be the voltage across the points C-B in FIG. 1; in this case also, the above-described advantageous results of the first embodiment of the invention can be realized.

Configuration of a Second Embodiment

Figure 5:
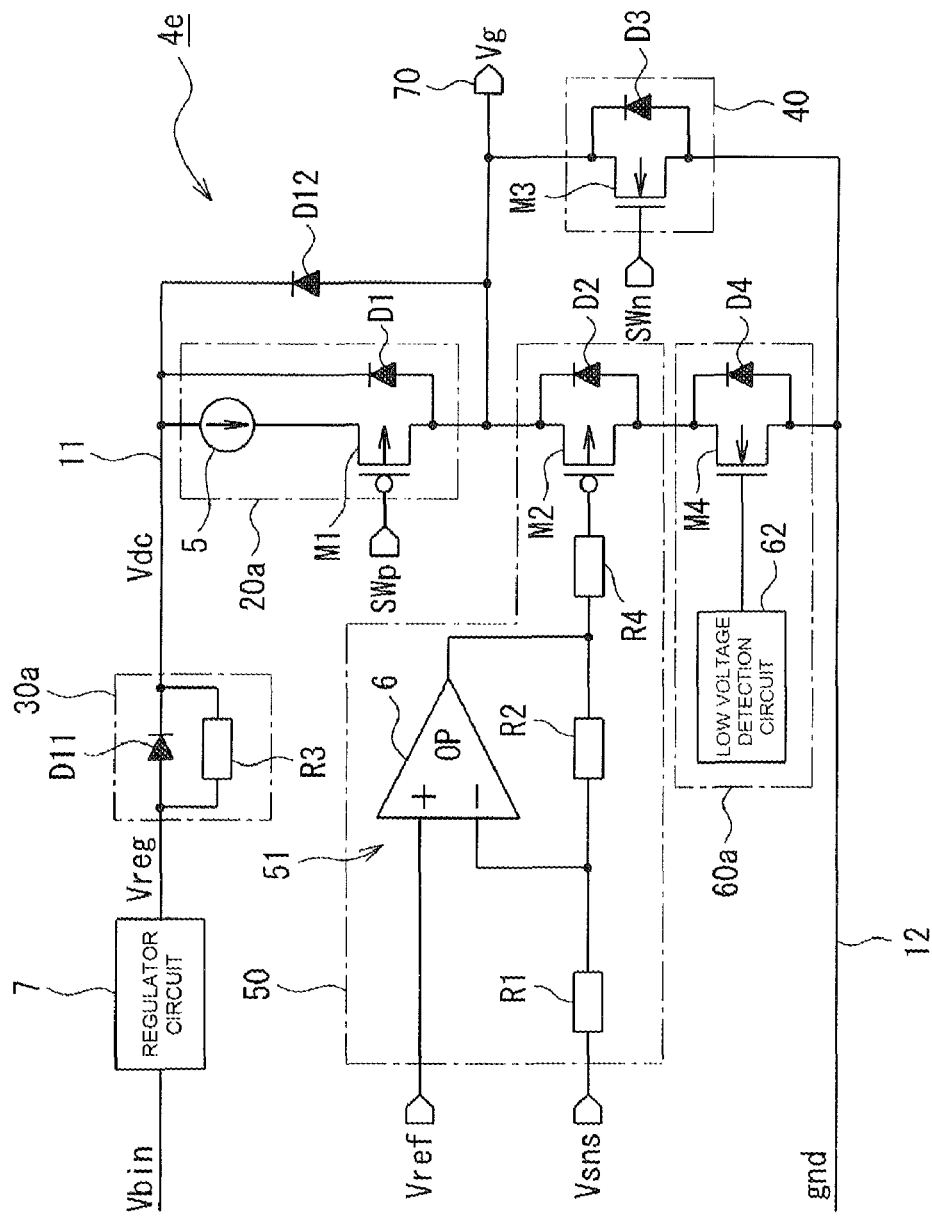
FIG. 5 is a circuit diagram of the control IC of a second embodiment of a gate driving device of the invention.

A second embodiment of a gate driving device of the invention is based on the configuration of the first embodiment shown in FIG. 1, but with the control IC 4d shown in FIG. 5 substituted for the control IC 4c shown in FIG. 1 and FIG. 2.

(Configuration of the Control IC)

Next, a specific configuration of the gate control portion of the control IC 4d is explained, referring to FIG. 5.

The gate control portion of the control IC 4d is connected between the internal power supply line 11 and the ground line 12 connected to ground gnd, as shown in FIG. 5.

That is, as shown in FIG. 5, the gate control portion of the control IC 4d comprises a regulator circuit 7, first protection circuit 30a, first switch portion 20a, second switch portion 40, current control portion 50, and second protection circuit 60a. These, except for the first protection circuit 30a, are provided between the high potential side power supply line 11 and the low potential side ground line 12.

Specifically, the first switch portion 20a and second switch portion 40 are connected in series between the power supply line 11 and the ground line 12. The connection portion common to the first switch portion 20a and the second switch portion 40 is connected to the output terminal 70, and the output terminal 70 is connected to the gate of the IGBT 3. The current control portion 50 and second protection circuit 60a are series-connected in parallel with the second switch portion 40.

The regulator circuit 7 and first protection circuit 30a are inserted into the power supply line 11. The regulator circuit 7 takes as input the voltage Vbin across points C-B in FIG. 1, and generates and outputs an output voltage Vreg which is stabilized based on the input voltage. This stabilized output voltage Vreg is supplied to the first protection circuit 30a.

The first protection circuit 30a comprises a parallel circuit of the diode D11 and resistor R3, and prevents or suppresses outflow of charge on the gate of the IGBT 3 to the regulator circuit 7.

The first switch portion 20a is provided between the power supply line 11 and the output terminal 70, and comprises a P-type MOS transistor M1 controlled to turn on and off by the switch signal Swp and a current source 5 connected in series with same. When turned on, the MOS transistor M1 charges the gate of the IGBT 3. A parasitic body diode D1 and a diode D12 are each connected in parallel with the series circuit of the MOS transistor M1 and the current source 5.

The second switch portion 40 comprises an N-type MOS transistor M3 which is controlled to turn on and off by the switch signal Swn, and includes a parasitic body diode D3 connected in parallel with the MOS transistor M3. The parallel circuit of the MOS transistor M3 and the diode D3 is connected between the output terminal 70 and the ground line 12. When turned on, the MOS transistor M3 causes discharge of the charge on the gate of the IGBT 3.

The current control portion 50 controls the outflow of charge on the gate of the IGBT 3 to the ground line 12 such that the collector current flowing in the IGBT 3 is constant.

To this end, the current control portion 50 comprises a MOS transistor M2 connected between the output terminal 70 and the MOS transistor M4 of the second protection circuit 60a, and an error amplifier 51 which controls the gate voltage of the MOS transistor M2. The error amplifier 51 comprises an op-amp 6 and resistors R1, R2 and R4. The error amplifier 51 generates a voltage according to the difference between the current sense voltage Vsns input from the current sense terminal s of the IGBT 3 and the reference voltage Vref, and outputs the generated voltage to the MOS transistor M2.

The second protection circuit 60a is provided between the current control portion 50 and the ground line 12. The second protection circuit 60a detects momentary voltage drops in the voltage Vbin of the external power supply, and upon detecting that the power supply voltage is in a low power supply voltage state lower than normal, interrupts the connection between the current control portion 50 and the ground line 12.

To this end, the second protection circuit 60a comprises a low voltage detection circuit 62 which detects momentary voltage drops in the voltage Vbin of the external power supply and a low power supply voltage state thereof, and a MOS transistor M4 which immediately turns off when the low voltage detection circuit 62 detects these. The MOS transistor M4 is connected in parallel to a parasitic body diode D4. This parallel circuit is connected between the MOS transistor M2 of the current control portion 50 and the ground line 12.

Figure 6:
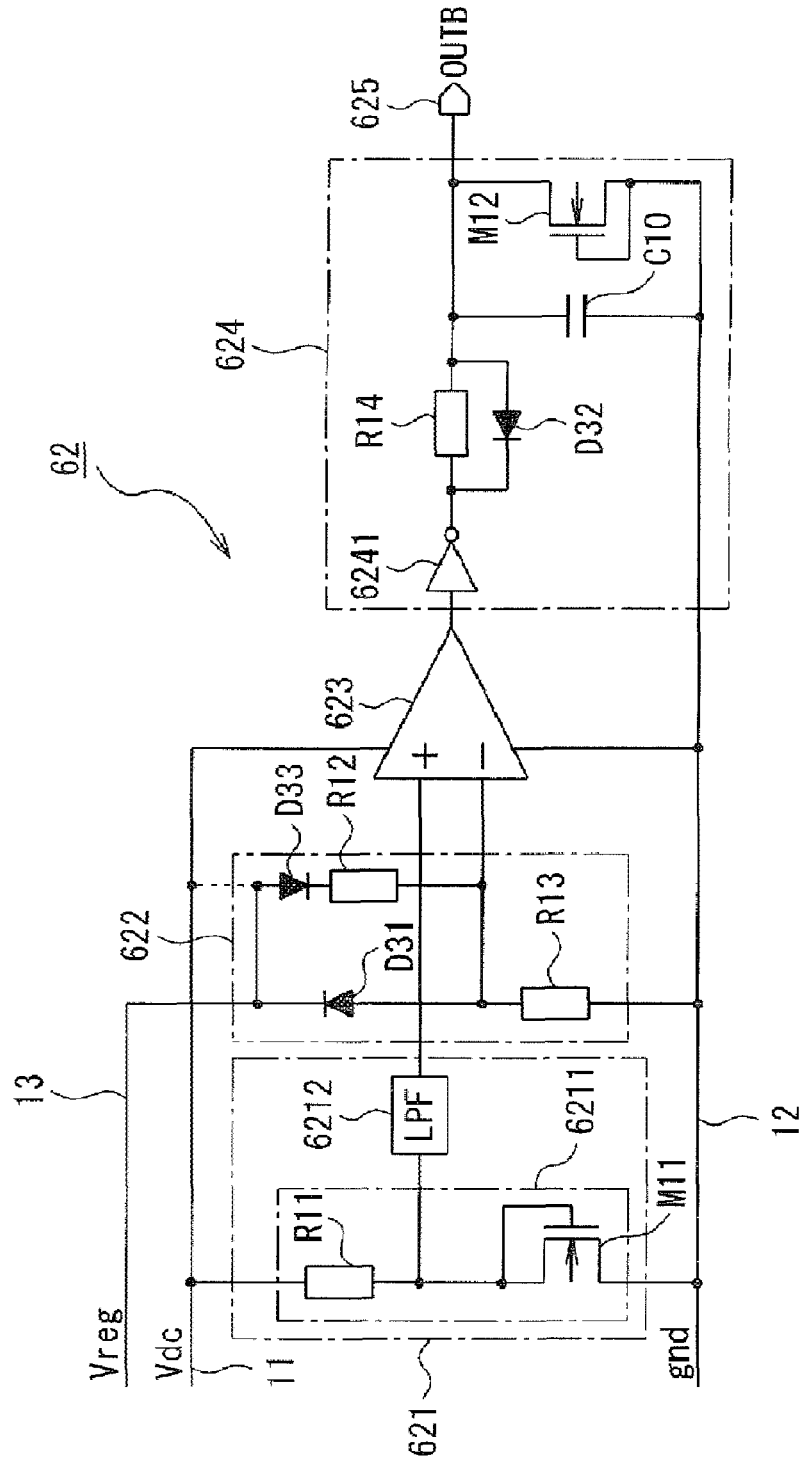
FIG. 6 is a circuit diagram showing the specific configuration of the low voltage detection circuit shown in FIG. 5.

Next, a specific configuration of the low voltage detection circuit 62 shown in FIG. 5 is explained, referring to FIG. 6.

As shown in FIG. 6, the low voltage detection circuit 62 comprises a reference voltage generation circuit 621, a voltage detection circuit 622, a self-biased type comparator 623, an output circuit 624, and an output terminal 625.

The reference voltage generation circuit 621 is connected to the internal power supply voltage Vdc which is the voltage of the power supply line 11, and generates a voltage with reference to ground gnd; this voltage is smoothed and output to the non-inverting input terminal (+) of the comparator 623.

The voltage detection circuit 622 takes as input the output voltage Vreg of the regulator circuit 7, generates a voltage according to this input voltage, and outputs the generated voltage to the inverting input terminal (−) of the comparator 623.

Here, the output voltage of the reference voltage generation circuit 621 (the input voltage V+ of the non-inverting input terminal (+) of the comparator 623) is set so that, compared with the output voltage of the voltage detection circuit 622 (the input voltage V− of the non-inverting terminal (−) of the comparator 623), rising is early, and after rising, is low compared with the output voltage of the voltage detection circuit 622 (see FIG. 7(B)). Further, when there is a momentary drop in the voltage Vbin of the external power supply, the drop in the output voltage of the reference voltage generation circuit 621 is small, and the drop in the output voltage of the voltage detection circuit 622 is large (see FIG. 8(C)).

Specifically, the reference voltage generation circuit 621 comprises a voltage division circuit 6211 which divides the internal power supply voltage Vdc, and a low-pass filter 6212 which smoothes and outputs the divided voltage of the voltage division circuit 6211.

The voltage division circuit 6211 comprises a series circuit of a resistor R11 and a diode-connected transistor M11 connected in series; this series circuit is connected between the power supply line 11 and the ground line 12. The connection portion common to the voltage division circuit 6211 is connected to the input terminal of the low-pass filter 6212. The output terminal of the low-pass filter 6212 is connected to the non-inverting input terminal (+) of the comparator 623.

The voltage detection circuit 622 comprises a voltage division circuit which takes as input the output voltage Vreg of the regulator circuit 7, and divides this input voltage. The voltage division circuit comprises a series circuit in which a diode D33, resistor R12, and resistor R13 are connected in series.

In this series circuit, the anode of the diode D33 is connected to the power supply line 11 and to the line 13 to which the voltage Vreg is supplied, and one end of the resistor R13 is connected to the ground line 12. The connection portion common to the resistor R12 and the resistor R13 is connected to the inverting input terminal (−) of the comparator 623. And, the portion at which the diode D33 and resistor R12 are series connected is connected antiparallel to the diode D31. That is, the anode of the diode D31 is connected to one end of the resistor R12, and the cathode is connected to the anode of the diode D33.

Here, the series circuit in which the diode D33, resistor R12 and resistor R13 are connected in series has resistance values and similar set so as to determine the DC level of the input voltage V− of the inverting input terminal (−) of the comparator 623. Further, when the power supply voltage momentarily drops, the diode D31 can momentarily lower the input voltage V− of the inverting input terminal (−) of the comparator 623.

Further, the same functions can be realized if the anode of the diode D33 is connected not to the cathode of the diode D31, but to the internal voltage Vdc, as indicated by the dashed line in FIG. 6.

The comparator 623 is driven by the internal power supply voltage Vdc applied to the power supply line 11, compares the output voltage of the reference voltage generation circuit 621 and the output voltage of the voltage detection circuit 622, generates a signal according to the comparison result, and outputs the generated signal to the output circuit 624.

The output circuit 624 generates a signal to turn the MOS transistor M4 on or off based on the output signal of the comparator 623.

To this end, the output circuit 624 comprises an inverter 6241, a resistor R14, a diode D32, and a depression type MOS transistor M12.

The inverter 6241 logically inverts the output signal of the comparator 623, and outputs this logically inverted signal. The resistor R14 is connected between the output side of the inverter 6241 and the output terminal 625, and the diode D32 is connected in parallel with the resistor R14.

The depression type MOS transistor M12 reliably clamps the voltage of the output terminal 625 at ground gnd in the low power supply voltage range equal to or less than the threshold voltage of the inverter 6241, and connects the output terminal 625 and the ground line 12.

In FIG. 6, C10 is the capacitance between the output terminal 625 and ground gnd, and forms a filter with the resistor R14 during charging, but during discharging, serves to remove the charge immediately via the diode D32.

Figure 7:
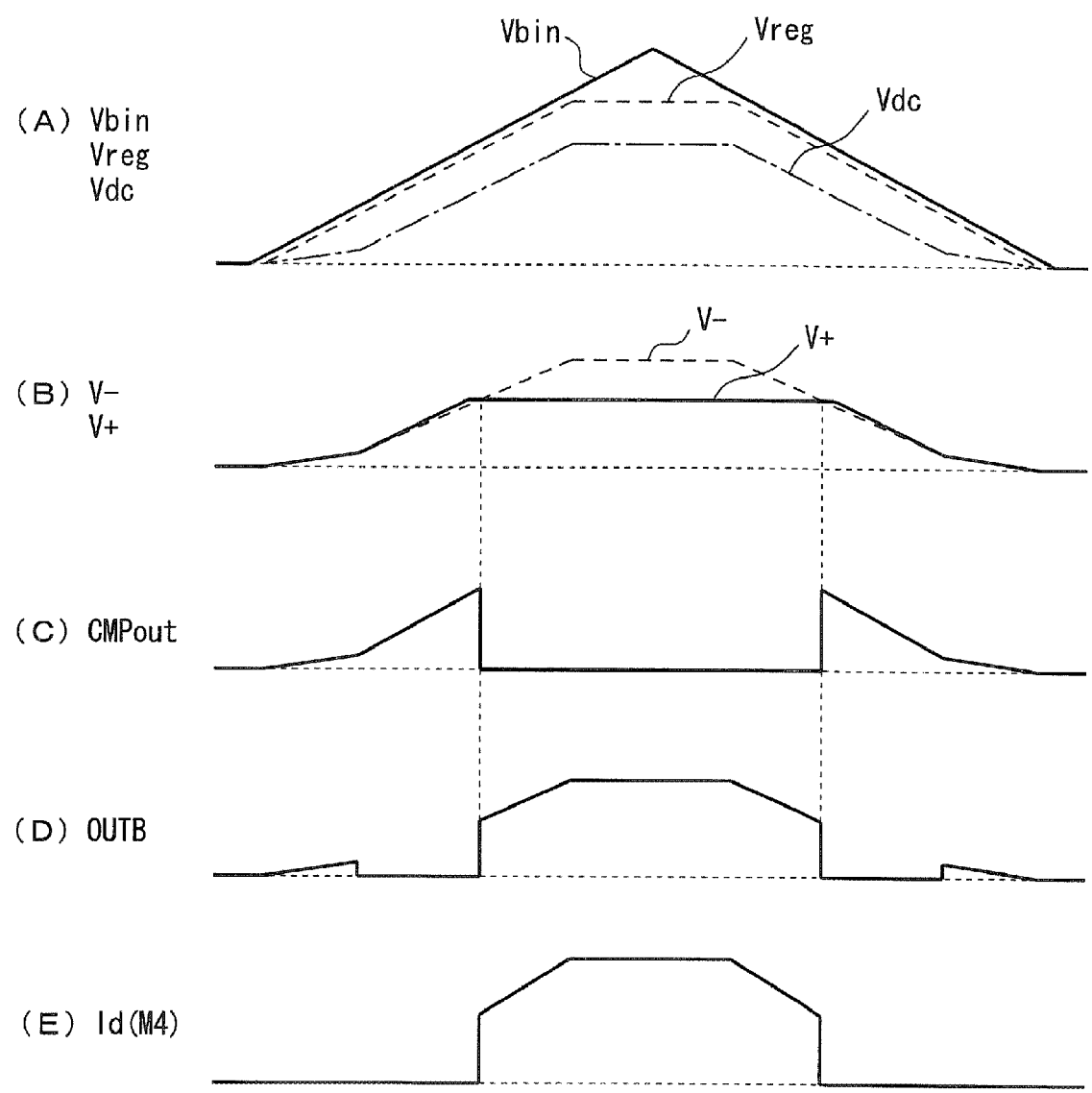
FIG. 7 is a waveform diagram of different portions to explain operation corresponding to direct-current voltage changes in the low voltage detection circuit shown in FIG. 6.

Next, in the example of operation of the low voltage detection circuit 62 shown in FIG. 6, operation in a case in which the power supply voltage changes to DC voltage is explained with reference to FIG. 5 to FIG. 7.

As shown in FIG. 7(A), the voltage Vbin across points C-B in FIG. 1 is raised (increased) from the minimum value (0 V) to the maximum value, and after reaching the maximum value is lowered (reduced) to the minimum value.

Such changes in the voltage Vbin are accompanied by rises in the output voltage Vreg of the regulator circuit 7 shown in FIG. 5 and the internal power supply voltage Vdc, while maintaining the relationship Vreg>Vdc, as shown in FIG. 7(A); each then becomes a constant value and is maintained as a constant value. Thereafter, they fall from their constant values to the minimum values.

These changes are accompanied by the changes shown in FIG. 7(B) in the input voltage V+ of the non-inverting input terminal (+) and the input voltage V− of the inverting input terminal (−) of the comparator 623 shown in FIG. 6. That is, in the low power supply voltage range in which the power supply voltage is low, the input voltage V+ is greater than the input voltage V−. But when the power supply voltage is in the range of normal values, the input voltage V− is greater than the input voltage V+.

As explained above, this is because the rise in the output voltage of the reference voltage generation circuit 621 is set to be early compared with the rise in the output voltage of the voltage detection circuit 622, and because, on the other hand, after the voltage rise, the output voltage of the voltage detection circuit 622 is set to be high compared with the output voltage of the reference voltage generation circuit 621.

Consequently, as shown in FIG. 7(C), the output CMPout of the comparator 623 goes to H level (high level) in the low power supply voltage range in which the power supply voltage is low, and goes to L level (low level) when the power supply voltage is in the range of normal values. Very low voltage levels in FIG. 7(C) are induced by unstable rise and fall of power supply.

The output of the comparator 623 is logically inverted by the inverter 6241, and so the inverter 6241 outputs a voltage according to the output of the comparator 623. Consequently the output voltage OUTB of the low voltage detection circuit 62 shown in FIG. 6 goes to L level in the low power supply voltage range when the power supply voltage is low, and oges to H level when the power supply voltage is in the range of normal values, as shown in FIG. 7(D).

This output voltage OUTB is applied to the gate of the MOS transistor M4 shown in FIG. 5. As a result, the drain current Id of the MOS transistor M4 becomes the current shown in FIG. 7(E). That is capability is provided such that the drain current Id of the MOS transistor M4 does not flow in the low power supply voltage range in which the power supply voltage is low, but flows when the power supply voltage is in the range of normal values.

Hence in the low power supply voltage range in which the power supply voltage is low, the MOS transistor M4 is turned off. Consequently there is no outflow of charge which charges the gate of the IGBT 3 to the ground line 12 via the MOS transistor M4, and no drop in the gate voltage of the IGBT 3, and the current Ic flowing in the IGBT 3 is not limited. On the other hand, in the range of normal values for the power supply voltage, the MOS transistor M4 is turned on, so that control of the collector current Ic of the IGBT 3 by the current control portion 50 is maintained.

Figure 8:
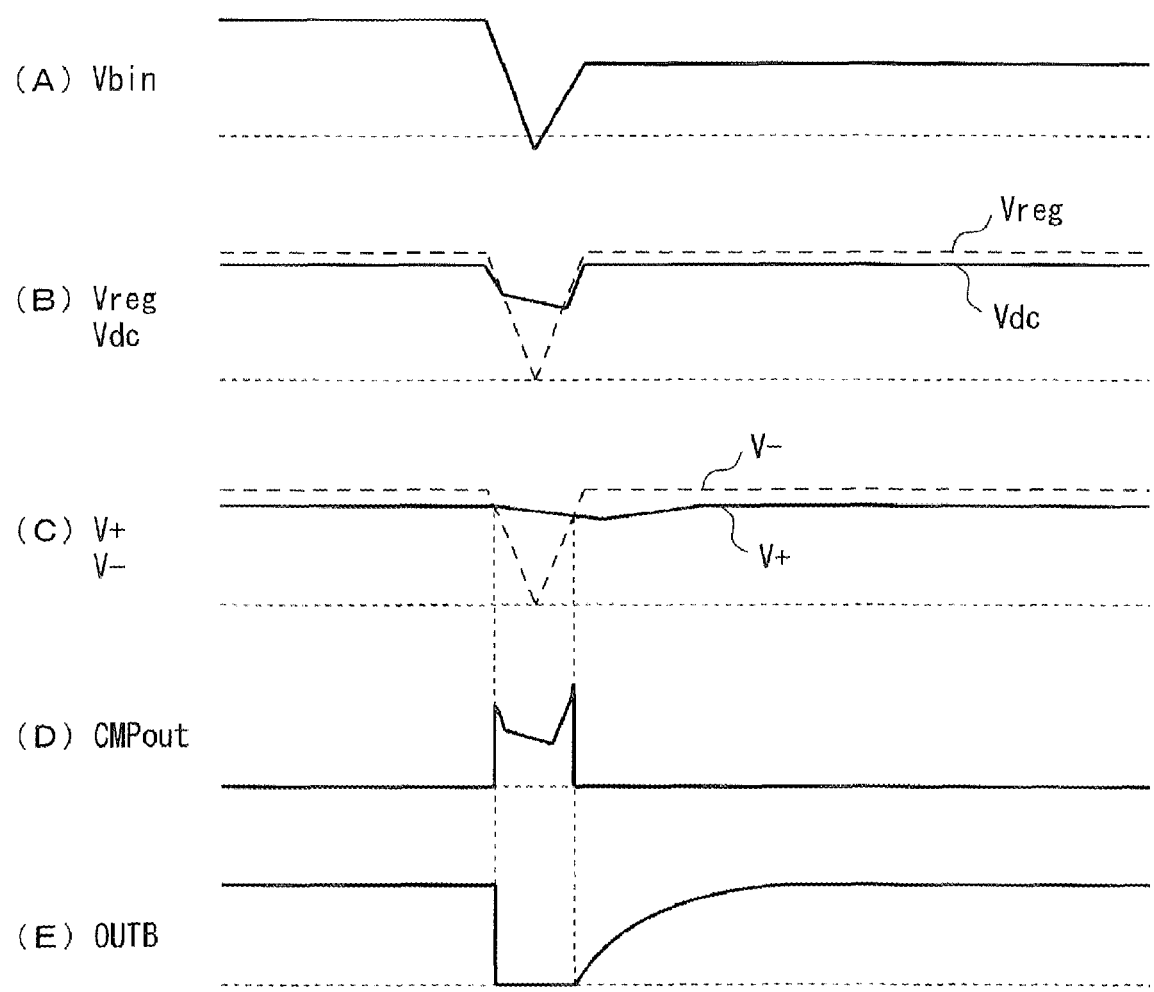
FIG. 8 is a waveform diagram of different portions to explain operation corresponding to transient voltage changes in the low voltage detection circuit shown in FIG. 6.

Next, an example of operation of the low voltage detection circuit 62 shown in FIG. 6, which is operation in a case in which the power supply voltage momentarily drops, is explained referring to FIG. 5, FIG. 6 and FIG. 8.

As shown in FIG. 8(A), when the voltage Vbin input to the regulator circuit 7 momentarily drops, the output voltage Vreg of the regulator circuit 7 drops to be approximately equal to the voltage Vbin, but a drop in the internal power supply voltage Vdc is suppressed, as shown in FIG. 8(B).

This is because charge which charges the gate of the IGBT 3 is caused to move to the power supply line 11 via through diodes D1 and D12 of the control IC 4e of FIG. 5, and moreover outflow of charge is prevented by the first protection circuit 30a.

Here, the gradual drop in the internal power supply voltage Vdc is due to the fact that charge is supplied to the regulator circuit 7 via the resistor R3 of the first protection circuit 30a, and simultaneously charge flows out due to current consumption of the different circuits which use the internal power supply voltage Vdc as a power supply.

This voltage change is accompanied by changes in the input voltage V+ of the non-inverting input terminal (+) and in the input voltage V− of the inverting input terminal (−) of the comparator 623 as shown in FIG. 8(C). That is, the input voltage V− follows the internal power supply voltage Vdc in a state which is made redundant by the amount of the forward-direction voltage of the diode D31, while the input voltage V+ is comparatively stable due to the action of the low-pass filter 6212.

Consequently when the voltage Vbin drops momentarily, the input voltage V− of the comparator 623 becomes lower than the input voltage V+ (see FIG. 8(C)), and so the output CMPout of the comparator 623 momentarily goes to H level, as shown in FIG. 8(D).

As a result, the output of the inverter 6241 changes from H level to L level, so that the charge on the capacitor C10 is momentarily discharged via the diode D32. Consequently the output voltage OUTB of the output circuit 624 momentarily goes to L level (see FIG. 8(E)), and so the MOS transistor M4 is turned off.

When the voltage Vbin has recovered from a momentary drop, the output of the inverter 6241 changes from L level to H level, but due to the filter of the resistor R14 and capacitor C10, the output voltage OUTB rises slowly. By setting the capacitance C10 so as to make this rise time match the recovery times from the momentary drop of the various circuits, the MOS transistor M4 is made to conduct when the various circuits are in a normal operating state.

Hence when the voltage Vbin drops momentarily, due to the outflow of charge which charges the gate of the IGBT 3 to the ground line 12 via the MOS transistor M4, the gate voltage of the IGBT 3 drops, and the current Ic flowing in the IGBT 3 is not limited.

Figure 9:
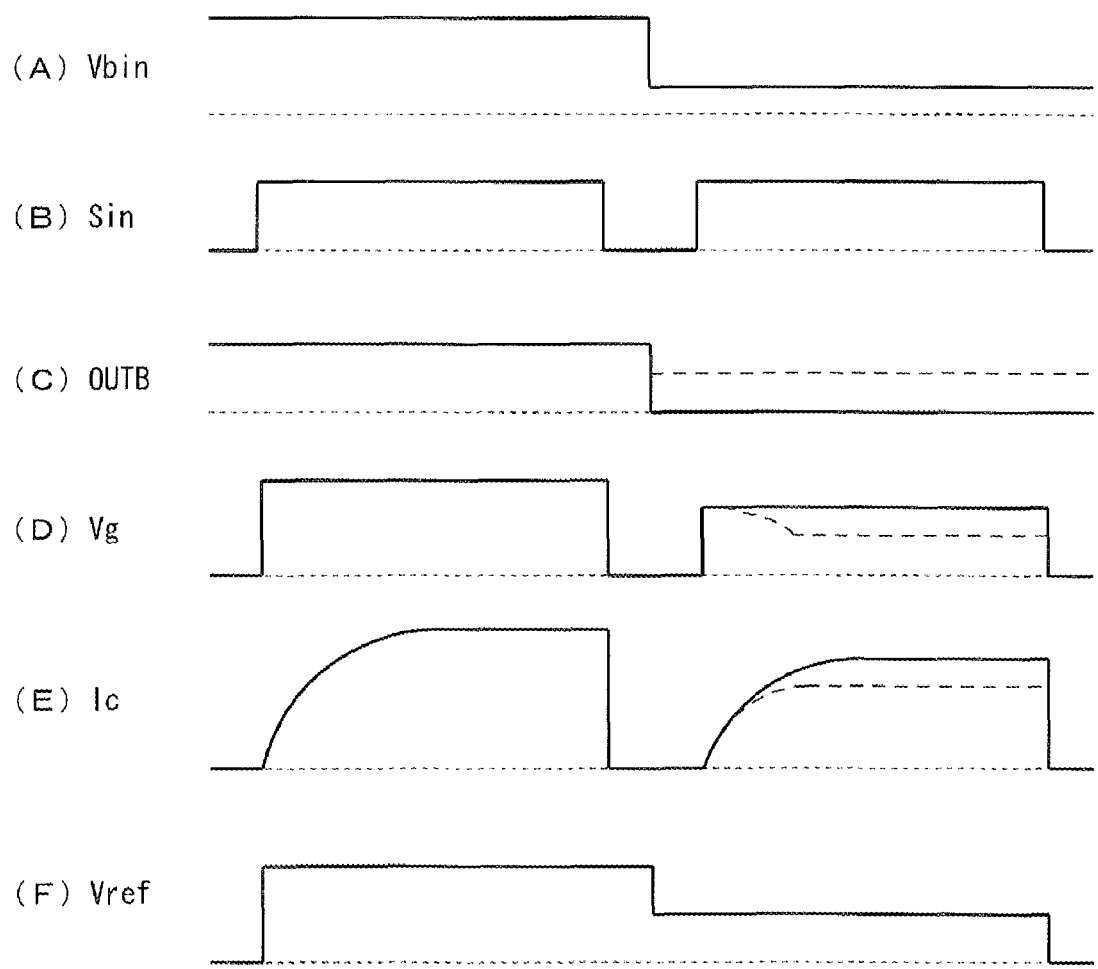
FIG. 9 is a waveform diagram of different portions to explain operation when the power supply voltage in the second embodiment is at low voltage.

Next, waveforms of different portions when the power supply voltage is at a low power supply voltage in the second embodiment are explained, referring to FIG. 9.

In FIG. 9, solid lines are examples of waveforms of different portions in the second embodiment, and dashed lines are examples of waveforms in an example of the prior art. Further, left-side halves are for a case in which the power supply voltage is in the steady state, and right-side halves are for a case of a low power supply voltage.

FIG. 9(A) shows the power supply voltage (external power supply voltage) Vbin input to the regulator circuit 7 of FIG. 5. FIG. 9(B) shows a control signal Sin (not shown) input to the control IC 4e of FIG. 5, corresponding to the control signal Sin input to the control IC 4c shown in FIG. 1. Based on this control signal Sin, switch signals Swp and Swn are generated which turn on and off the MOS transistors M1 and M3 shown in FIG. 5.

Figure 14:
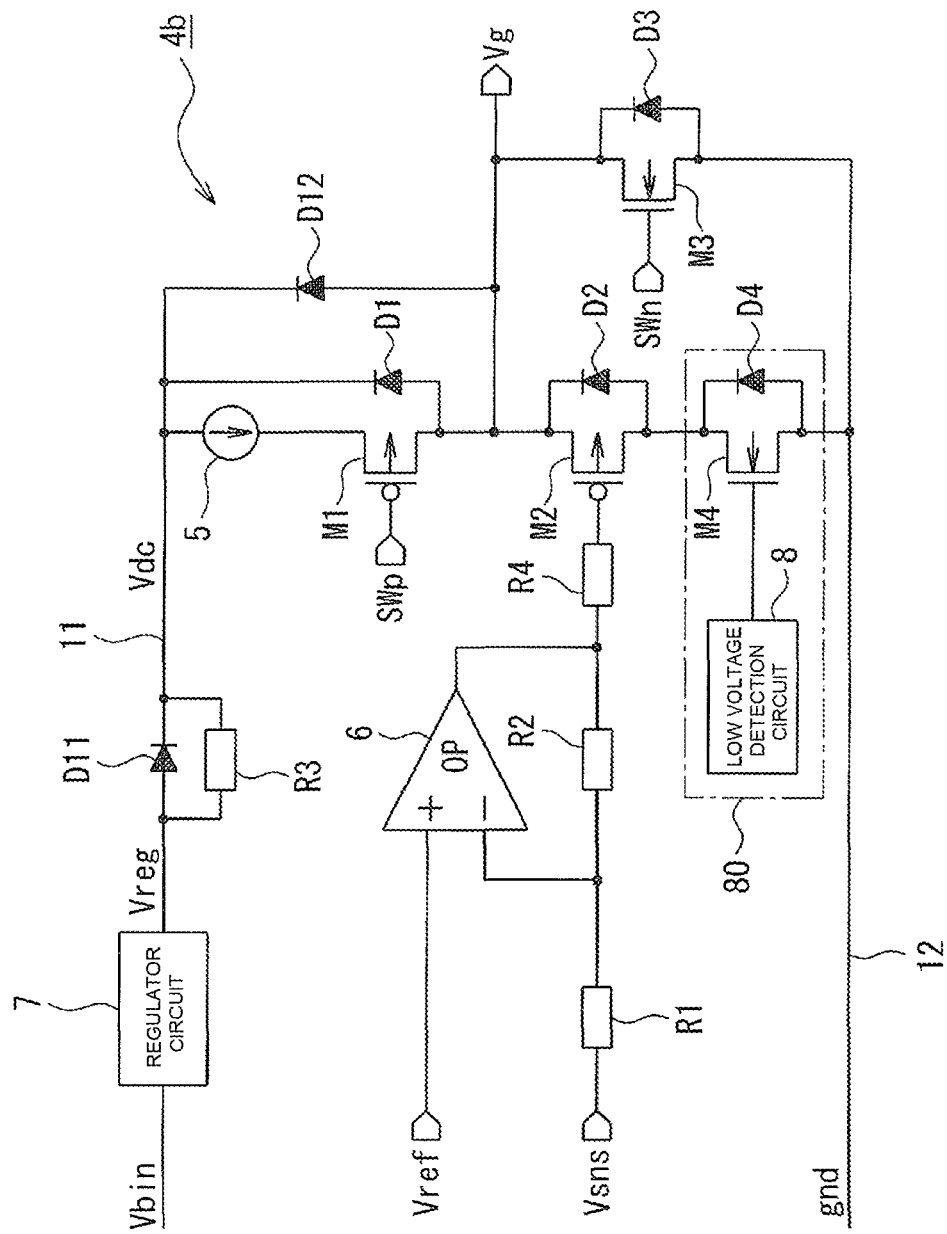
FIG. 14 is a circuit diagram of a control IC, as an improvement over the control IC shown in FIG. 13.
Figure 15:
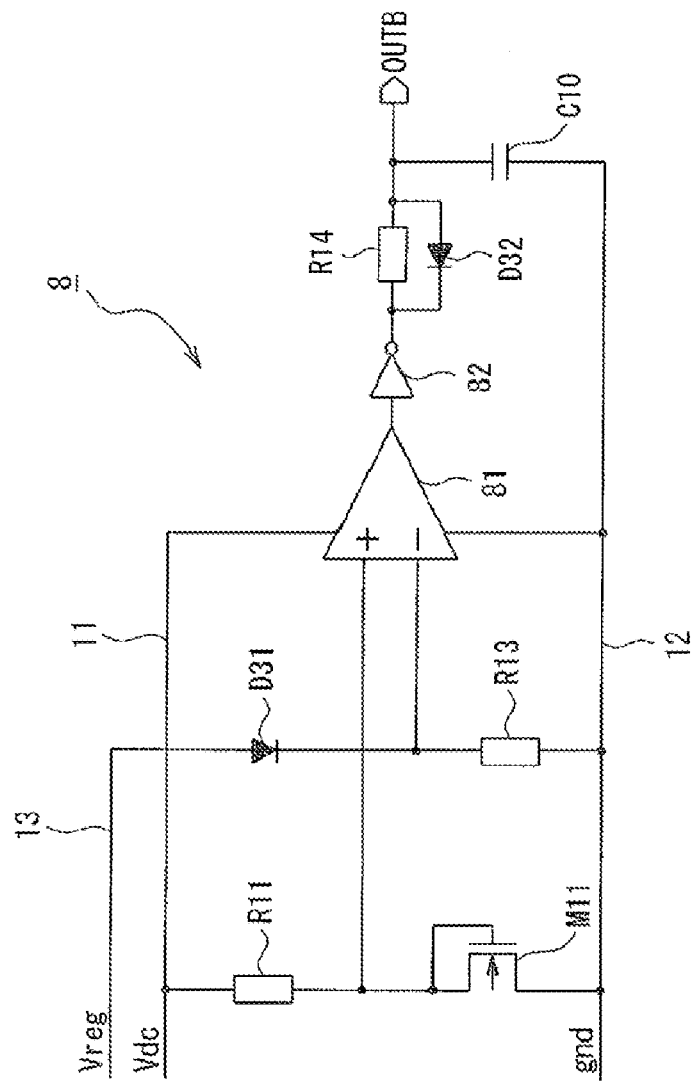
FIG. 15 is a circuit diagram showing a specific configuration of the low voltage detection circuit shown in FIG. 14.

FIG. 9(C) shows the output voltage OUTB (solid line) of the low voltage detection circuit 62 of FIG. 6 and the output voltage OUTB (dashed line) of the low voltage detection circuit 8 of FIG. 15. FIG. 9(D) shows the output voltage Vg (gate voltage of the IGBT 3) of the control IC 4e of FIG. 5 and the output voltage Vg of the control IC 4b of FIG. 14. FIG. 9(E) shows the collector current Ic of the IGBT 3. FIG. 9(F) shows the voltage Vref input to the non-inverting amplification terminal of the op-amp 6 of FIG. 5.

On the left side and the right side of FIG. 9(D), the levels of the gate voltage Vg of the IGBT 3 are different, and on the left side and the right side of FIG. 9(E), the levels of the collector current Ic of the IGBT 3 are different; this is because the drop in the reference voltage Vref in FIG. 9(F) causes the op-amp 6 of FIG. 5 to perform current limiting operation.

Figure 16:
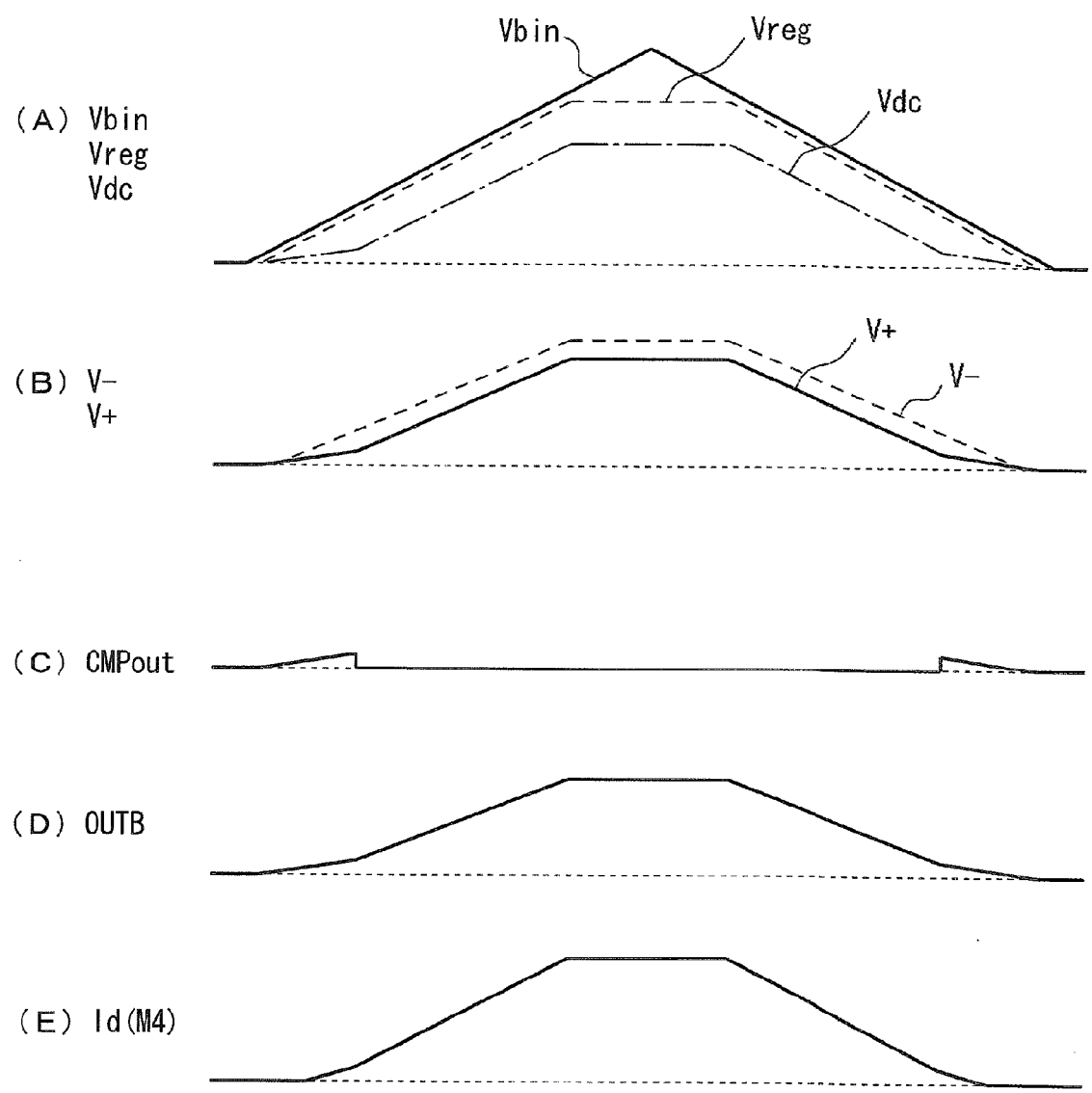
FIG. 16 is a waveform diagram of different portions to explain operation corresponding to direct-current voltage changes in the low voltage detection circuit shown in FIG. 15.

In operation at a low power supply voltage as described above, the output voltage OUTB of the low voltage detection circuit 8 shown in FIG. 15 goes to H level (see FIG. 16(D)). Consequently, in the example of the prior art, the gate voltage Vg of the IGBT 3 drops, and the collector current Ic is limited (see the dashed lines of FIGS. 9(C) to 9(F)).

However, in operation at a low power supply voltage such as that described above in the second embodiment, the output voltage OUTB of the low voltage detection circuit 62 goes to L level (see FIG. 7(D)). Consequently, in the second embodiment, there is no drop in the gate voltage Vg of the IGBT 3, and the collector current Ic is not limited (see the solid lines in FIGS. 9(C) to 9(F)).

Figure 10:
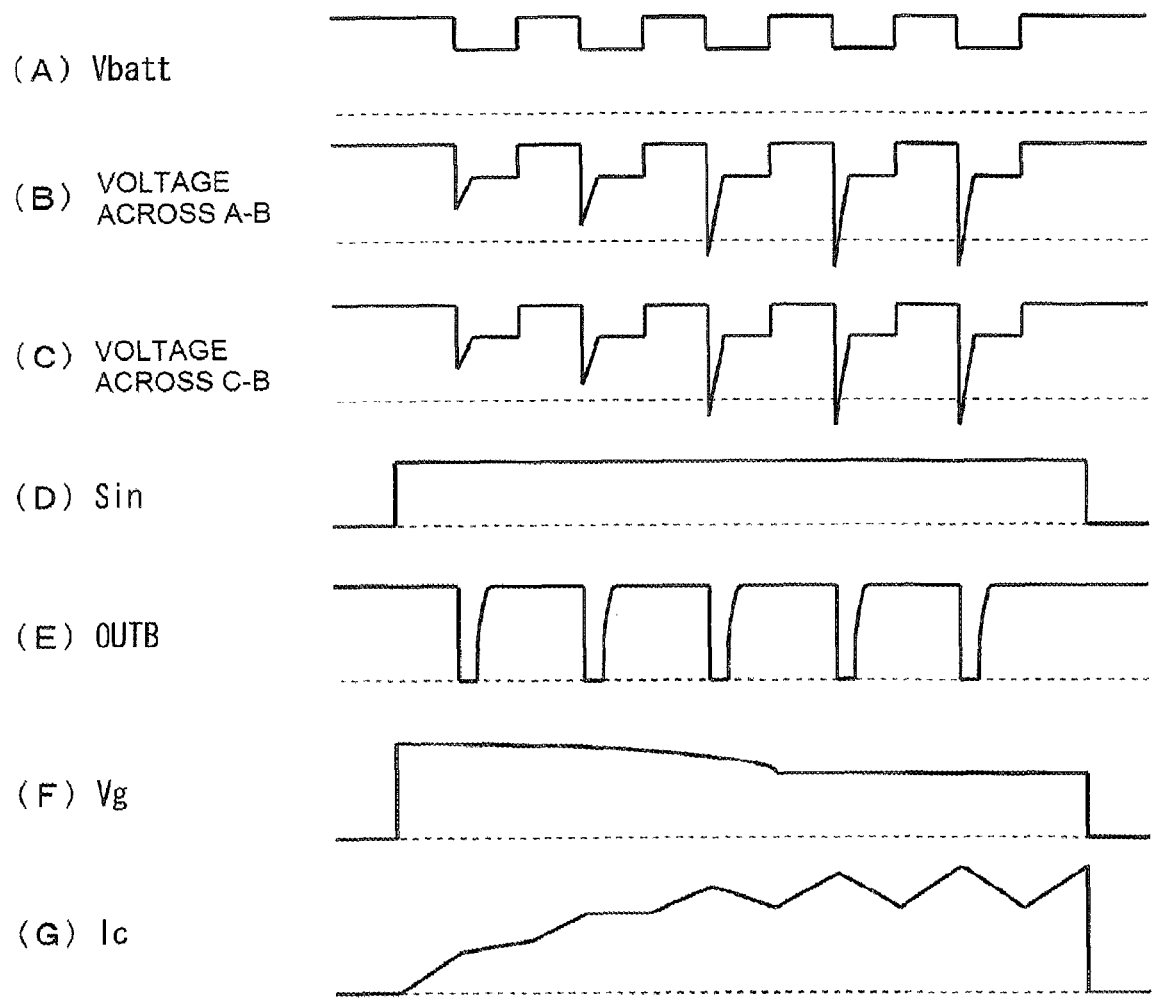
FIG. 10 is a waveform diagram of different portions to explain operation when a momentary voltage drop occurs in the power supply voltage in the second embodiment.

Next, examples of waveforms of different portions in a case in which the power supply voltage drops momentarily in the second embodiment are explained, referring to FIG. 10.

Suppose that the battery voltage Vbatt (see FIG. 1) is in a ripple state, as shown in FIG. 10(A). In this case, due to resonance of the resonance circuit formed by the wiring inductances L1 and L2 and the capacitor C1 shown in FIG. 1, a momentary drop occurs in the voltage across points A-B, as shown in FIG. 10(B). Accompanying this, the voltage across points C-B is as shown in FIG. 10(C), and changes substantially similarly to the voltage change across points A-B.

When momentary drops in the voltage across points A-B are repeated as in FIG. 10(B), the low voltage detection circuit 62 repeatedly detects the drops at the times of each of the momentary drops. Consequently the output voltage OUTB of the low voltage detection circuit 62 repeats a waveform in which at each momentary drop, the voltage, after going to L level, recovers to H level, as shown in FIG. 10(E).

Consequently, outflow of charge accumulated on the gate of the IGBT 3 is prevented, and drops in the gate voltage Vg of the IGBT 3 are prevented (see FIG. 10(F)), so that sharp declines in the collector current Ic of the IGBT 3 can be prevented (see FIG. 10(G)).

Advantageous Results of the Second Embodiment

As explained above, in this second embodiment a first protection circuit 30*a* and second protection circuit 60*a* are provided, as shown in FIG. 5. Hence in a state in which a bypass capacitor parallel to the control IC 4*e* is omitted, even when a momentary drop occurs in the power supply voltage input to the control IC 4*e*, fluctuations in the gate voltage Vg of the IGBT 3 can be suppressed to the extent possible, and adequate driving of the gate of the IGBT 3 can be secured.

Further, in this second embodiment, when the second protection circuit 60*a* detects not only a momentary voltage drop in the voltage Vbin of the external power supply but also a low power supply voltage state in which the power supply voltage is lower than normal, the connection between the current control portion 50 and the ground line 12 is interrupted. Hence by means of the second embodiment, during operation when the power supply voltage is low, drops in the gate voltage Vg of the IGBT 3 do not occur, and the IGBT 3 can be driven without limiting the collector current Ic.

INDUSTRIAL APPLICABILITY

This invention can be applied to driving control of the main switching devices of power conversion apparatuses, such as inverters, converters, and similar.

The invention claimed is:

1. A gate driving device which drives a gate of an active element with a high gate capacitance,
the device comprising:
a first switch portion connected between a first power supply line and a gate of the active element and which turns on the active element;
a second switch portion connected between the gate of the active element and a second power supply line supplied with a lower potential than the first power supply line and which turns off the active element;
a current control portion connected in parallel with the second switch portion and which controls outflow of charge on the gate of the active element to the second power supply line such that a current that flows in the active element is constant;
a first protection circuit connected between the first switch portion and the gate of the active element and which suppresses outflow of charge on the gate of the active element to the first power supply line; and
a second protection circuit connected between the current control portion and the second power supply line and which detects a prescribed fluctuation in an applied voltage between the first power supply line and the second power supply line, and when the fluctuation is detected, interrupts connection between the current control portion and the second power supply line,
wherein the first switch portion comprises a first transistor, the first transistor operates as a constant current source when the active element is turned on, and halts operation as the constant current source when the active element is turned off, and
the first switch portion further comprises:
a second transistor which forms a current mirror circuit with the first transistor; and
a third transistor which is connected in series with the second transistor and which turns on and off according to an on or off state of the active element.

2. The gate driving device according to claim 1, wherein the second protection circuit comprises:
a diode which prevents outflow of charge on the gate of the active element to the first power supply line; and
a resistor connected in parallel with the diode and which forms a low-pass filter with the gate capacitance of the active element.

3. A gate driving device which drives a gate of an active element with a high gate capacitance, the device comprising:
a first switch portion connected between a first power supply line and the gate of the active element and which turns on the active element;
a second switch portion connected between the gate of the active element and a second power supply line supplied with a lower potential than the first power supply line and which turns off the active element;
a current control portion connected in parallel with the second switch portion and which controls the outflow of charge on the gate of the active element to the second power supply line such that a current that flows in the active element is constant;
a first protection circuit connected between an external power supply and the first power supply line and which suppresses outflow of charge on the gate of the active element to the external power supply; and
a second protection circuit connected between the current control portion and the second power supply line and which, either upon detecting a momentary drop in an external power supply voltage or upon detecting that the external power supply voltage is in a low power supply voltage state, interrupts connection between the current control portion and the second power supply line,
wherein the second protection circuit comprises:
a first detection circuit which receives as first detection circuit input voltage a first protection circuit output voltage and smoothes and then outputs the first detection circuit input voltage as a first detection circuit output voltage;
a second detection circuit which receives as inputs a second detection circuit input voltage and the first protection circuit output voltage and generates and then outputs a second detection circuit output voltage according to the inputs;
a comparator which compares the first detection circuit output voltage and the second detection circuit output voltage and outputs a comparator output signal according to the comparison result; and
an output circuit which generates and outputs a prescribed signal based on the comparator output signal, and
the first detection circuit output voltage is set such that a rise thereof is early compared with a rise of the second detection circuit output voltage, and after the rise of the first detection circuit output voltage, the first detection circuit output voltage is set to become low compared with the second detection circuit output voltage, and
an amount of a drop in the first detection circuit output voltage is set to be small compared with an amount of a drop in the second detection circuit output voltage when the external power supply voltage momentarily falls.

4. The gate driving device according to claim 3, wherein the first detection circuit comprises:

a first voltage division circuit including a resistor and a transistor which divides the first protection circuit output voltage by using the resistor and the transistor and outputs a first divided voltage; and a low-pass filter which smoothes the first divided voltage.

5. The gate driving device according to claim 3, wherein the second detection circuit comprises a second voltage division circuit comprising a first diode, a first resistor, and a second resistor in a series circuit, which receives as inputs the first protection circuit output voltage and the first protection circuit input voltage, and divides and then outputs the inputs by using the series circuit, and a second diode is connected to the series connection portion of the first diode and the first resistor.

6. The gate driving device according to claim 3, wherein the second protection circuit further comprises a clamp circuit connected between output terminals of the output circuit.

* * * * *